(12) United States Patent
Huang

(10) Patent No.: US 12,489,014 B2
(45) Date of Patent: Dec. 2, 2025

(54) METHOD FOR FABRICATING SEMICONDUCTOR DEVICE WITH MULTI-CARBON-CONCENTRATION DIELECTRICS

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 598 days.

(21) Appl. No.: 17/741,365

(22) Filed: May 10, 2022

(65) Prior Publication Data

US 2023/0369097 A1   Nov. 16, 2023

(51) Int. Cl.
| H01L 21/768 | (2006.01) |
| H01L 23/522 | (2006.01) |
| H01L 23/528 | (2006.01) |
| H01L 23/532 | (2006.01) |

(52) U.S. Cl.
CPC .. *H01L 21/76804* (2013.01); *H01L 21/76846* (2013.01); *H01L 21/76877* (2013.01)

(58) Field of Classification Search
CPC ......... H01L 21/76804; H01L 21/76843; H01L 21/76846; H01L 21/76802; H01L 21/76835; H01L 23/53295; H01L 23/5329
USPC .................................. 438/638–640; 257/774
See application file for complete search history.

(56) References Cited

U.S. PATENT DOCUMENTS

| 6,251,770 B1 * | 6/2001 | Uglow .............. H01L 21/02304 438/638 |
| 6,350,670 B1 * | 2/2002 | Andideh ........... H01L 21/76801 438/618 |
| 6,362,091 B1 * | 3/2002 | Andideh ........... H01L 21/76807 438/692 |

(Continued)

FOREIGN PATENT DOCUMENTS

| CN | 114093844 A | 2/2022 |
| TW | 200416946 A | 9/2004 |
| TW | 201733069 A | 9/2017 |

OTHER PUBLICATIONS

Office Action of TW Application No. 111123658 dated Feb. 22, 2023, 6 pages.

(Continued)

*Primary Examiner* — Mohsen Ahmadi
(74) *Attorney, Agent, or Firm* — MUNCY, GEISSLER, OLDS & LOWE, P.C.

(57) ABSTRACT

The present application discloses provides a method for fabricating a semiconductor device. The method includes forming a first insulating layer on a substrate; forming a bottom contact in the first insulating layer; sequentially forming a bottom dielectric layer, a lower middle dielectric layer, a higher middle dielectric layer, and a top dielectric layer on the first insulating layer; performing an opening-etching process to form an opening along the top dielectric layer, the higher middle dielectric layer, the lower middle dielectric layer, and the bottom dielectric layer to expose the bottom contact; and forming a conductive structure in the opening. A carbon concentration of the lower middle dielectric layer is greater than a carbon concentration of the bottom dielectric layer.

18 Claims, 13 Drawing Sheets

(56) References Cited

U.S. PATENT DOCUMENTS

| | | | |
|---|---|---|---|
| 2003/0042605 A1* | 3/2003 | Andideh | H01L 23/5329 |
| | | | 257/742 |
| 2004/0198057 A1* | 10/2004 | Huang | H01L 23/53295 |
| | | | 257/E21.279 |
| 2016/0218219 A1 | 7/2016 | Asami et al. | |
| 2017/0263850 A1* | 9/2017 | Ito | H10B 61/22 |
| 2018/0082917 A1 | 3/2018 | Cheng et al. | |
| 2019/0288084 A1 | 9/2019 | Wang et al. | |
| 2020/0006126 A1* | 1/2020 | Liou | H01L 21/76825 |
| 2021/0035907 A1 | 2/2021 | Chen et al. | |
| 2021/0091190 A1* | 3/2021 | Huang | H10D 30/024 |
| 2022/0102279 A1* | 3/2022 | Madhavan | H01L 21/76825 |
| 2022/0415791 A1 | 12/2022 | Guler et al. | |
| 2023/0036104 A1* | 2/2023 | Baek | H10D 84/0149 |
| 2023/0066228 A1* | 3/2023 | Cheng | H01L 21/02115 |
| 2023/0178426 A1* | 6/2023 | Zink | H01L 21/76832 |
| 2023/0187476 A1* | 6/2023 | Sato | H10D 1/696 |
| | | | 257/295 |

OTHER PUBLICATIONS

Office Action of TW Application No. 111123659 dated Feb. 20, 2023, 13 pages.

* cited by examiner

METHOD FOR FABRICATING SEMICONDUCTOR DEVICE WITH MULTI-CARBON-CONCENTRATION DIELECTRICS

TECHNICAL FIELD

The present disclosure relates to a method for fabricating the semiconductor device a semiconductor device, and more particularly, to a method for fabricating the semiconductor device a semiconductor device with multi-carbon-concentration dielectrics.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a first insulating layer positioned on a substrate; a bottom contact positioned in the first insulating layer; a bottom dielectric layer, a lower middle dielectric layer, a higher middle dielectric layer, and a top dielectric layer sequentially stacked on the first insulating layer; and a conductive structure including a bottom portion positioned in the bottom dielectric layer and on the bottom contact, a lower middle portion positioned on the bottom portion and in the lower middle dielectric layer, a higher middle portion positioned on the lower middle portion and in the higher middle dielectric layer, and a top portion positioned on the higher middle portion and in the top dielectric layer. A carbon concentration of the lower middle dielectric layer is greater than a carbon concentration of the bottom dielectric layer.

Another aspect of the present disclosure provides a semiconductor device including a first insulating layer positioned on a substrate; a bottom contact positioned in the first insulating layer; a bottom dielectric layer, a higher middle dielectric layer, and a top dielectric layer sequentially stacked on the first insulating layer; and a conductive structure including a bottom portion positioned in the bottom dielectric layer and on the bottom contact, a higher middle portion positioned on the bottom portion and in the higher middle dielectric layer, and a top portion positioned on the higher middle portion and in the top dielectric layer. A carbon concentration of the higher middle dielectric layer is greater than a carbon concentration of the bottom dielectric layer.

Another aspect of the present disclosure provides a method for fabricating a semiconductor device including forming a first insulating layer on a substrate; forming a bottom contact in the first insulating layer; sequentially forming a bottom dielectric layer, a lower middle dielectric layer, a higher middle dielectric layer, and a top dielectric layer on the first insulating layer; performing an opening-etching process to form an opening along the top dielectric layer, the higher middle dielectric layer, the lower middle dielectric layer, and the bottom dielectric layer to expose the bottom contact; and forming a conductive structure in the opening. A carbon concentration of the lower middle dielectric layer is greater than a carbon concentration of the bottom dielectric layer.

Due to the design of the semiconductor device of the present disclosure, the critical dimensions can be controlled even using the same etching chemistry for different layers of the insulating stack by employing different carbon concentrations for different layers of the insulating stack. As a result, the overlay of the conductive structure to the bottom contact may be improved. In addition, the parasitic capacitance originating from adjacent conductive structures may be kept low due to the small critical dimension of the higher middle portion of the conductive structure.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
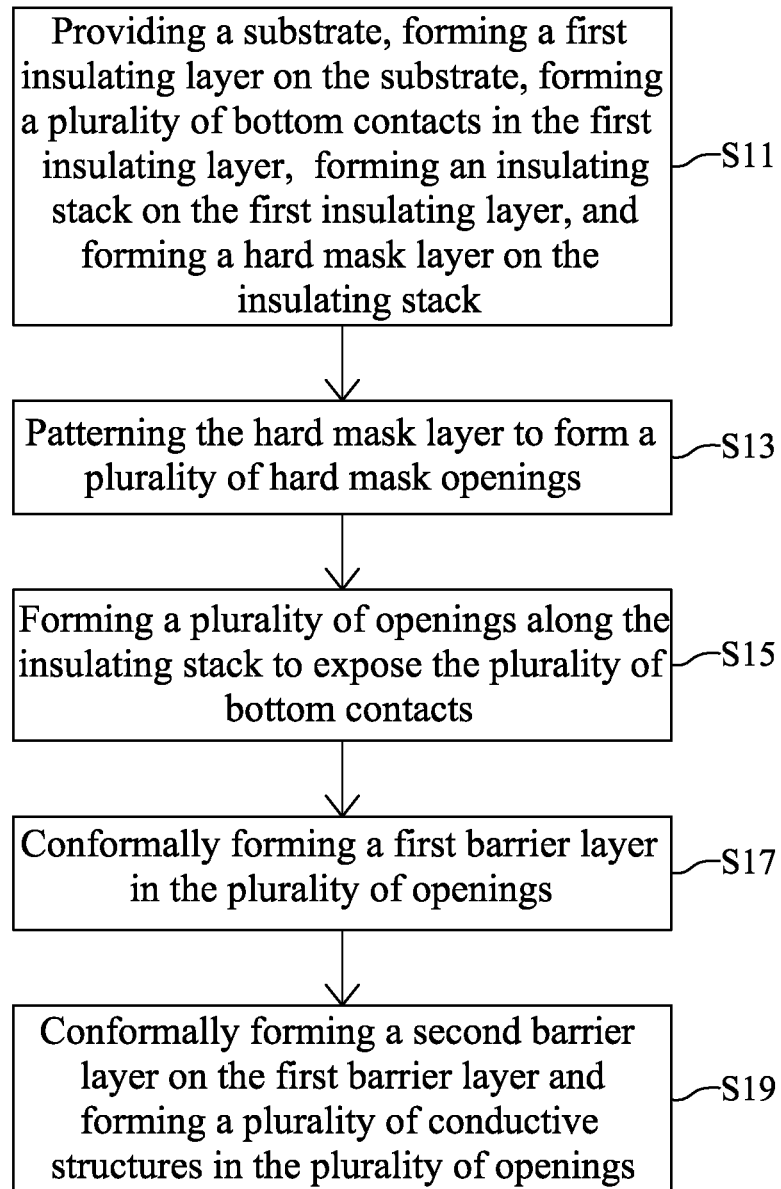
FIG. 1 illustrates, in a flowchart diagram form, a method for fabricating a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

FIG. 1 illustrates, in a flowchart diagram form, a method 10 for fabricating a semiconductor device 1A in accordance with one embodiment of the present disclosure. FIGS. 2 to 6 illustrate, in schematic cross-sectional view diagrams, part of a flow for fabricating the semiconductor device 1A in accordance with one embodiment of the present disclosure. FIG. 7 is a chart showing an example of process conditions for forming a first barrier layer 601 in accordance with one embodiment of the present disclosure.

Figure 2:
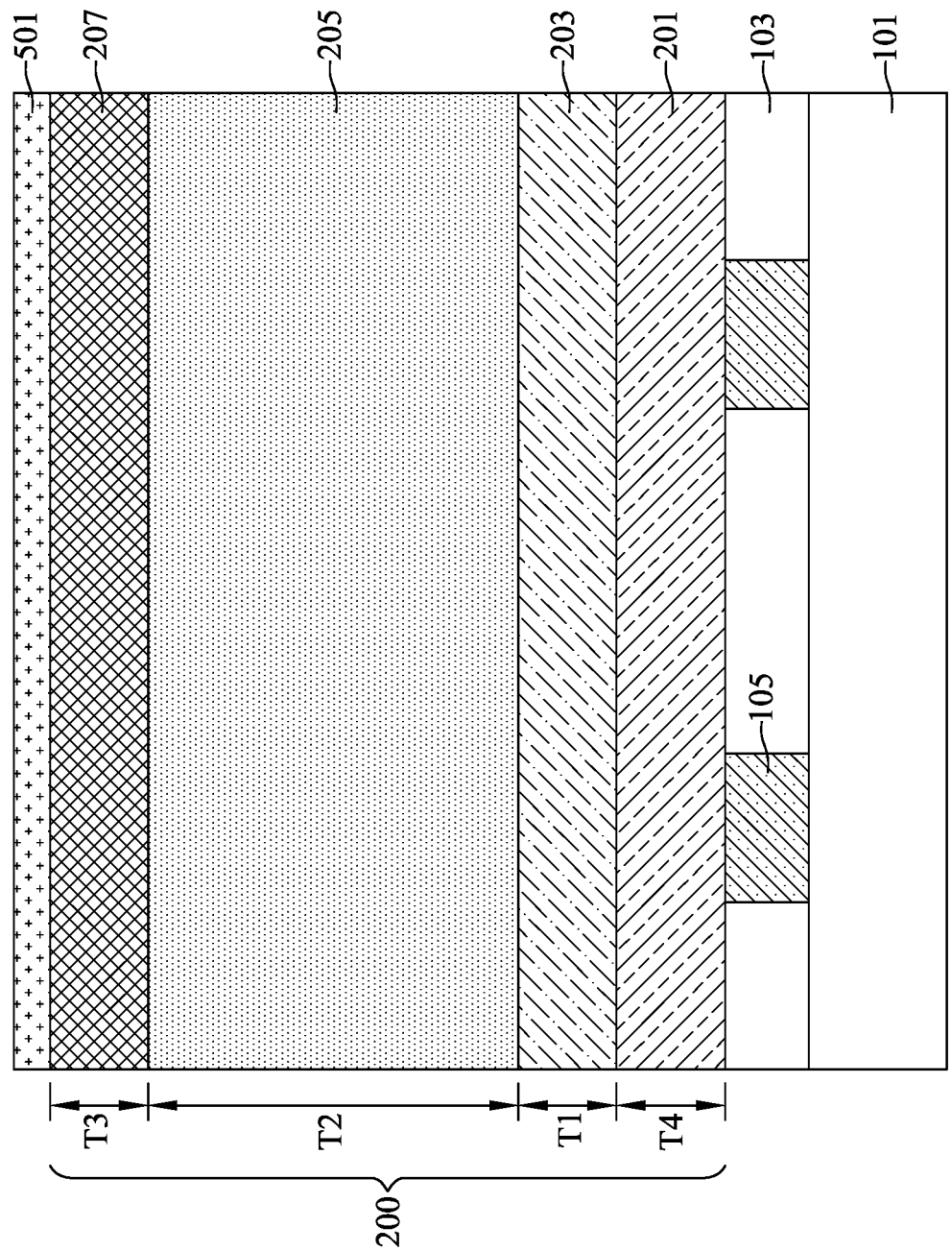
FIGS. 2 to 6 illustrate, in schematic cross-sectional view diagrams, part of a flow for fabricating the semiconductor device in accordance with one embodiment of the present disclosure.

With reference to FIGS. 1 and 2, at step S11, a substrate 101 may be provided, a first insulating layer 103 may be formed on the substrate 101, a plurality of bottom contacts 105 may be formed in the first insulating layer 103, an insulating stack 200 may be formed on the first insulating layer 103, and a hard mask layer 501 may be formed on the insulating stack 200.

With reference to FIG. 2, the substrate 101 may include a bulk semiconductor substrate that is composed entirely of at least one semiconductor material, a plurality of device elements (not show for clarity), a plurality of dielectric layers (not shown for clarity), and a plurality of conductive features (not show for clarity). The bulk semiconductor substrate may be formed of, for example, an elementary semiconductor, such as silicon or germanium; a compound semiconductor, such as silicon germanium, silicon carbide, gallium arsenide, gallium phosphide, indium phosphide, indium arsenide, indium antimonide, or other III-V compound semiconductor or II-VI compound semiconductor; or combinations thereof.

In some embodiments, the substrate 101 may include a semiconductor-on-insulator structure which consists of, from bottom to top, a handle substrate, an insulator layer, and a topmost semiconductor material layer. The handle substrate and the topmost semiconductor material layer may be formed of the same material as the bulk semiconductor substrate aforementioned. The insulator layer may be a crystalline or non-crystalline dielectric material such as an oxide and/or nitride. For example, the insulator layer may be a dielectric oxide such as silicon oxide. For another example, the insulator layer may be a dielectric nitride such as silicon nitride or boron nitride. For yet another example, the insulator layer may include a stack of a dielectric oxide and a dielectric nitride such as a stack of, in any order, silicon oxide and silicon nitride or boron nitride. The insulator layer may have a thickness between about 10 nm and 200 nm.

It should be noted that, the term "about" modifying the quantity of an ingredient, component, or reactant of the present disclosure employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

With reference to FIG. 2, the plurality of device elements may be formed on the bulk semiconductor substrate or the topmost semiconductor material layer. Some portions of the plurality of device elements may be formed in the bulk semiconductor substrate or the topmost semiconductor material layer. The plurality of device elements may be transistors such as complementary metal-oxide-semiconductor transistors, metal-oxide-semiconductor field-effect transistors, fin field-effect-transistors, the like, or a combination thereof.

With reference to FIG. 2, the plurality of dielectric layers may be formed on the bulk semiconductor substrate or the topmost semiconductor material layer and cover the plurality of device elements. In some embodiments, the plurality of dielectric layers may be formed of, for example, silicon oxide, borophosphosilicate glass, undoped silicate glass, fluorinated silicate glass, low-k dielectric materials, the like, or a combination thereof. The low-k dielectric materials may have a dielectric constant less than 3.0 or even less than 2.5. In some embodiments, the low-k dielectric materials may have a dielectric constant less than 2.0. The plurality of dielectric layers may be formed by deposition processes such as chemical vapor deposition, plasma-enhanced chemical vapor deposition, or the like. Planarization processes may be performed after the deposition processes to remove excess material and provide a substantially flat surface for subsequent processing steps.

With reference to FIG. 2, the plurality of conductive features may include interconnect layers and conductive vias. The interconnect layers may be separated from each other and may be horizontally disposed in the plurality of dielectric layers along the direction Z. The conductive vias may connect adjacent interconnect layers along the direction Z, and adjacent device element and interconnect layer. In some embodiments, the conductive vias may improve heat dissipation and may provide structure support. In some embodiments, the plurality of conductive features may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of conductive features may be formed during the formation of the plurality of dielectric layers.

In some embodiments, the plurality of device elements and the plurality of conductive features may together configure functional units in the substrate 101. A functional unit, in the description of the present disclosure, generally refers to functionally related circuitry that has been partitioned for functional purposes into a distinct unit. In some embodiments, functional units may be typically highly complex circuits such as processor cores, memory controllers, or accelerator units. In some other embodiments, the complexity and functionality of a functional unit may be more or less complex.

With reference to FIG. 2, the first insulating layer 103 may be formed on the substrate 101 and may be formed of, for example, silicon dioxide, undoped silicate glass, fluorosilicate glass, borophosphosilicate glass, a spin-on low-k dielectric layer, a chemical vapor deposition low-k dielectric layer, or a combination thereof. In some embodiments, the first insulating layer 103 may include a self-planarizing material such as a spin-on glass or a spin-on low-k dielectric material such as SiLK™. The use of a self-planarizing dielectric material may avoid the need to perform a subsequent planarizing step. In some embodiments, the first insulating layer 103 may be formed by a deposition process including, for example, chemical vapor deposition, plasma enhanced chemical vapor deposition, evaporation, or spin-on coating. In some embodiments, a planarization process, such as chemical mechanical polishing, may be performed to provide a substantially flat surface for subsequent processing steps.

With reference to FIG. 2, the plurality of bottom contacts 105 may be formed along the first insulating layer 103 and may be electrically coupled to the device element of the substrate 101 through corresponding conductive features of the substrate 101. In some embodiments, the plurality of bottom contacts 105 may be formed of, for example, tungsten, cobalt, zirconium, tantalum, titanium, aluminum, ruthenium, copper, metal carbides (e.g., tantalum carbide, titanium carbide, tantalum magnesium carbide), metal nitrides (e.g., titanium nitride), transition metal aluminides, or a combination thereof. The plurality of bottom contacts 105 may be formed by, for example, a damascene process or other applicable processes.

With reference to FIG. 2, the insulating stack 200 may include a bottom dielectric layer 201, a lower middle dielectric layer 203, a higher middle dielectric layer 205, and a top dielectric layer 207.

With reference to FIG. 2, the bottom dielectric layer 201 may be formed on the first insulating layer 103. In some embodiments, the bottom dielectric layer 201 may be formed of, for example, silicon dioxide, undoped silicate glass, fluorosilicate glass, borophosphosilicate glass, silicon nitride, silicon oxynitride, silicon nitride oxide, phosphosilicate glass, or a combination thereof. In some embodiments, the bottom dielectric layer 201 may be a high-k dielectric material (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. In the present embodiment, the bottom dielectric layer 201 is silicon oxide or silicon nitride.

With reference to FIG. 2, the lower middle dielectric layer 203 may be formed on the bottom dielectric layer 201. In some embodiments, the lower middle dielectric layer 203 may be formed of, for example, carbon-doped oxide or organosilicate glass. In some embodiments, the lower middle dielectric layer 203 may be formed of, for example, a spin-on low-k dielectric layer, a chemical vapor deposition low-k dielectric layer, porous polymeric material, or a combination thereof.

With reference to FIG. 2, the higher middle dielectric layer 205 may be formed on the lower middle dielectric layer 203. In some embodiments, the higher middle dielectric layer 205 may be formed of, for example, carbon-doped oxide or organosilicate glass. In some embodiments, the higher middle dielectric layer 205 may be formed of, for example, a spin-on low-k dielectric layer, a chemical vapor deposition low-k dielectric layer, porous polymeric material, or a combination thereof.

With reference to FIG. 2, the top dielectric layer 207 may be formed on the higher middle dielectric layer 205. In some embodiments, the top dielectric layer 207 may be formed of, for example, carbon-doped oxide or organosilicate glass. In some embodiments, the top dielectric layer 207 may be formed of, for example, a spin-on low-k dielectric layer, a chemical vapor deposition low-k dielectric layer, porous polymeric material, or a combination thereof. In some embodiments, the lower middle dielectric layer 203 and the top dielectric layer 207 may be formed of the same material.

In some embodiments, the lower middle dielectric layer 203, the higher middle dielectric layer 205, and the top dielectric layer 207 may be porous layers formed by exposing an energy-removable material to an energy source such as heat, light, or a combination thereof. When heat is used as the energy source, a temperature of the energy treatment may be between about 800° C. and about 900° C. When light is used as the energy source, an ultraviolet light may be applied.

In some embodiments, the porous layers may include a skeleton and a plurality of empty spaces disposed among the skeleton. The plurality of empty spaces may connect to each other and may be filled with air. The skeleton may include, for example, low-dielectric materials, or methylsilsesquioxane. The porous layers may have a porosity between 25% and 75%. Due to the plurality of empty spaces, the porous layers are filled with air. As a result, a dielectric constant of the porous layers may be significantly lower than a layer formed of, for example, silicon oxide. Therefore, the porous layers may significantly reduce the parasitic capacitance between conductive features formed therein.

In some embodiments, the energy-removable material may include a material such as a thermal decomposable material, a photonic decomposable material, an e-beam decomposable material, or a combination thereof. For example, the energy-removable material may include a base material and a decomposable porogen material that is sacrificially removed upon being exposed to an energy source. In some embodiments, the decomposable porogen material may include a porogen organic compound that provides porosity to the base material of the energy-removable material.

In some embodiments, the porosity of the lower middle dielectric layer 203 (or the top dielectric layer 207) may be greater than the porosity of the higher middle dielectric layer 205. In some embodiments, the porosity of the lower middle dielectric layer 203 and the porosity of the top dielectric layer 207 may be substantially the same. In some embodiments, the porosity of the lower middle dielectric layer 203 and the porosity of the top dielectric layer 207 may be different. For example, the porosity of the top dielectric layer 207 may be greater than the porosity of the lower middle dielectric layer 203.

With reference to FIG. 2, in some embodiments, the carbon concentration of the lower middle dielectric layer 203 (or the top dielectric layer 207) may be greater than the carbon concentration of the higher middle dielectric layer 205. The carbon concentration of the higher middle dielectric layer 205 may be greater than the carbon concentration of the bottom dielectric layer 201. In some embodiments, the carbon concentration of the lower middle dielectric layer 203 and the carbon concentration of the top dielectric layer 207 may be substantially the same. In some embodiments, the carbon concentration of the lower middle dielectric layer 203 and the carbon concentration of the top dielectric layer 207 may be different. For example, the carbon concentration of the lower middle dielectric layer 203 may be greater than or less than the carbon concentration of the top dielectric layer 207.

With reference to FIG. 2, in some embodiments, the dielectric constant of the lower middle dielectric layer 203 (or the top dielectric layer 207) may be less than the dielectric constant of the higher middle dielectric layer 205. The dielectric constant of the higher middle dielectric layer 205 may be less than the dielectric constant of the bottom dielectric layer 201.

With reference to FIG. 2, in some embodiments, the thickness T1 of the lower middle dielectric layer 203 may be less than the thickness T2 of the higher middle dielectric layer 205. In some embodiments, the thickness T2 may be greater than the thickness T3 of the top dielectric layer 207.

In some embodiments, the thickness T1 of the lower middle dielectric layer 203 and the thickness T3 of the top dielectric layer 207 may be substantially the same. In some embodiments, the thickness T1 of the lower middle dielectric layer 203 and the thickness T3 of the top dielectric layer 207 may be different. For example, the thickness T1 of the lower middle dielectric layer 203 may be greater than the thickness T3 of the top dielectric layer 207.

In some embodiments, the thickness T1 of the lower middle dielectric layer 203 and the thickness T4 of the bottom dielectric layer 201 may be substantially the same. In some embodiments, the thickness T1 of the lower middle dielectric layer 203 and the thickness T4 of the bottom dielectric layer 201 may be different. For example, the thickness T4 of the bottom dielectric layer 201 may be greater than the thickness T1 of the lower middle dielectric layer 203.

With reference to FIG. 2, the hard mask layer 501 may be formed on the top dielectric layer 207. In some embodiments, the hard mask layer 501 may be formed of, for example, boron nitride, silicon boron nitride, phosphorus boron nitride, boron carbon silicon nitride, or the like. The hard mask layer 501 may be formed by a film formation process and a treatment process. Detailedly, in the film formation process, first precursors, which may be boron-based precursors, may be introduced over the top dielectric layer 207 to form a boron-based layer. Subsequently, in the treatment process, second precursors, which may be nitrogen-based precursors, may be introduced to react with the boron-based layer and turn the boron-based layer into the hard mask layer 501. In some embodiments, the first precursors may be, for example, diborane, borazine, or an alkyl-substituted derivative of borazine. In some embodiments, the second precursors may be, for example, ammonia or hydrazine.

Figure 3:
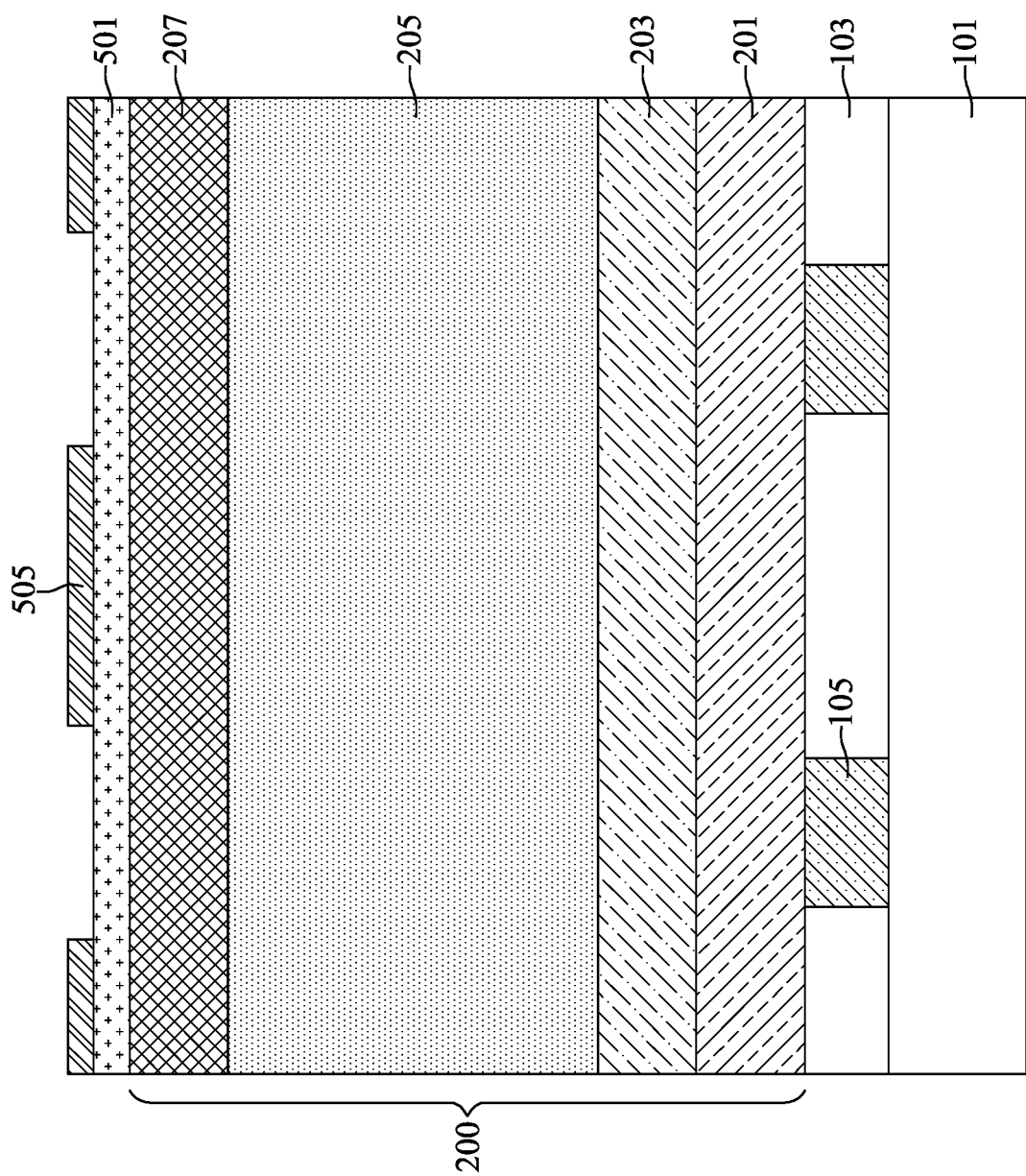
Figure 4:
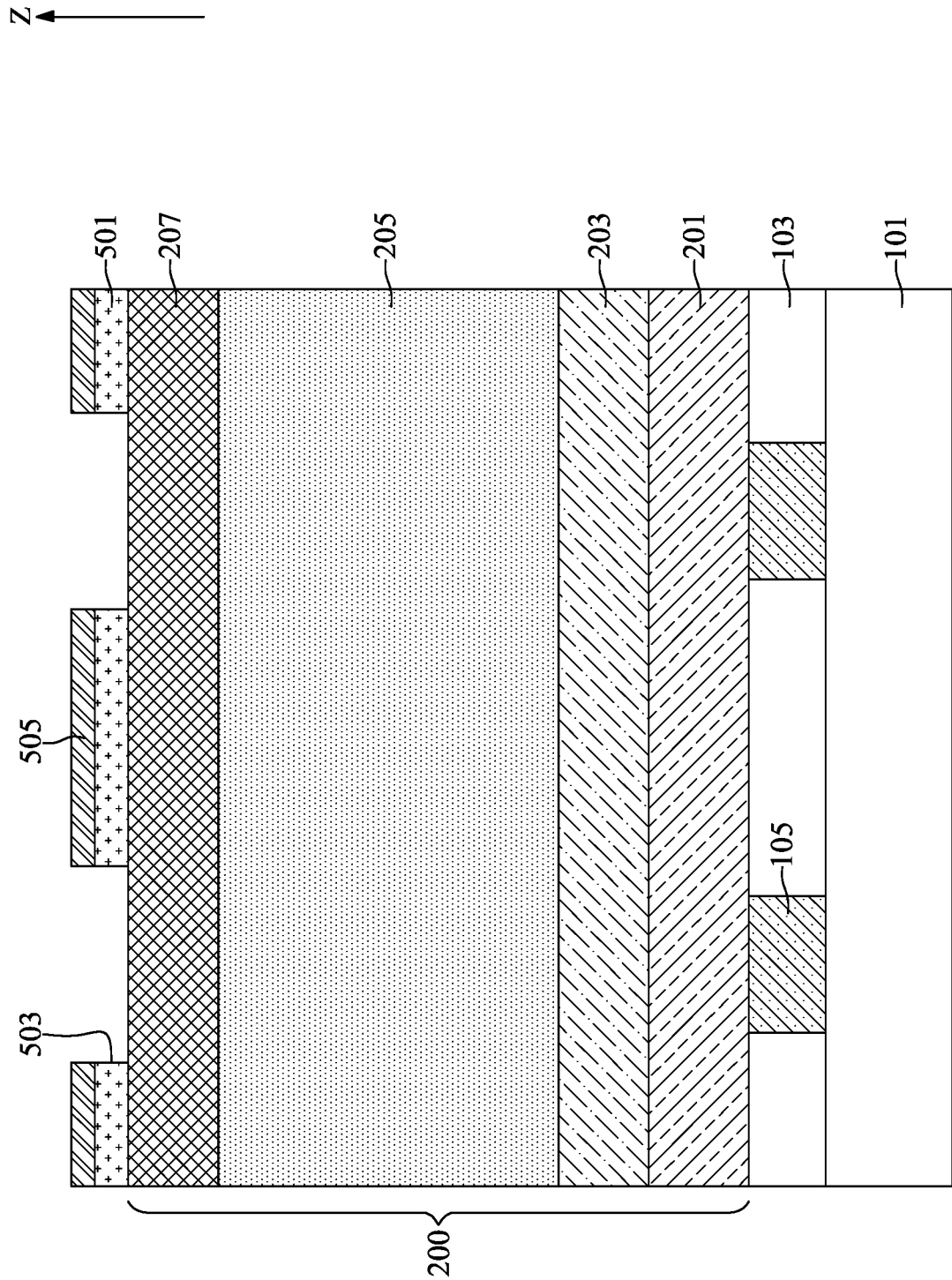

With reference to FIGS. 1, 3, and 4, at step S13, the hard mask layer 501 may be patterned to form a plurality of hard mask openings 503.

With reference to FIG. 3, a mask layer 505 may be formed on the hard mask layer 501. The mask layer 505 may be a photoresist layer and may include the pattern of the plurality of hard mask openings 503.

With reference to FIG. 4, a hard-mask-etching process may be performed to remove portions of the hard mask layer 501 to form the plurality of hard mask openings 503. Portions of the top dielectric layer 207 may be exposed through the plurality of hard mask openings 503. After the formation of the hard mask openings 503, the mask layer 505 may be removed by, for example, an ashing process or other applicable process.

Figure 5:
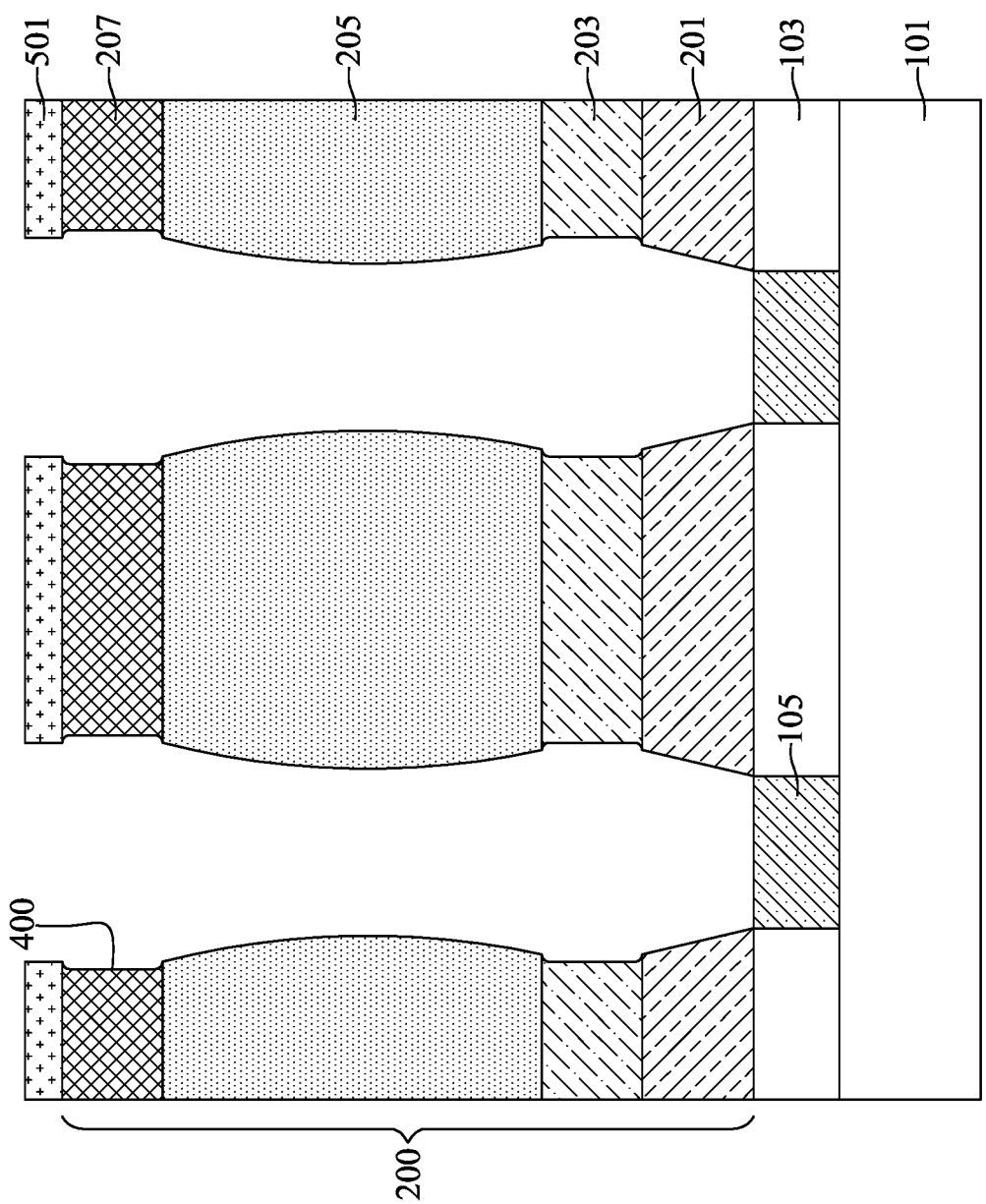

With reference to FIGS. 1 and 5, at step S15, a plurality of openings 400 may be formed along the insulating stack 200 to expose the plurality of bottom contacts 105.

For brevity, clarity, and convenience of description, only one opening 400 is described.

With reference to FIG. 5, an opening-etching process may be performed to remove portions of the top dielectric layer 207, the higher middle dielectric layer 205, lower middle dielectric layer 203, and the bottom dielectric layer 201 to form the opening 400. In some embodiments, the etching chemistries for the top dielectric layer 207, the higher middle dielectric layer 205, and the lower middle dielectric layer 203 may be the same during the opening-etching process. However, the etch rate to the higher middle dielectric layer 205 and the etching rate to the top dielectric layer 207 (or the lower middle dielectric layer 203) may be different during the opening-etching process. In some embodiments, the etch rate during the opening-etching process may be related to the carbon concentration of the corresponding layer. For example, the etch rate to the lower middle dielectric layer 203 (having a higher carbon concentration) may be higher than the etch rate to the higher middle dielectric layer 205 (having a lower carbon concentration).

Accordingly, the resulting profile of the opening 400 may be related to the etch rates to different layers. For example, for the top dielectric layer 207 (or the lower middle dielectric layer 203) having higher carbon concentration, the higher etch rate may result in an expanded sidewall profile which expands horizontally. In contrast, for the higher middle dielectric layer 205 having lower carbon concentration, the lower etch rate may result in a hyperbola-like sidewall profile.

With reference to FIG. 5, during the opening-etching process, the etching chemistries for the lower middle dielectric layer 203 may be different from the etching chemistries for the bottom dielectric layer 201. For example, the opening-etching process may be a two-stage-etching process that the first stage is for etching the top dielectric layer 207, the higher middle dielectric layer 205, and the lower middle dielectric layer 203, and the second stage is for etching the bottom dielectric layer 201. The resulting sidewall profile may be related to the etching chemistries. In some embodiments, the sidewall profile of the opening 400 corresponding to the bottom dielectric layer 201 may be tapered. In some embodiments, a width of the opening 400 corresponding to the bottom dielectric layer 201 may gradually become wider from bottom to top along the direction Z. In some embodiments, the sidewall profile of the opening 400 corresponding to the bottom dielectric layer 201 as a whole may have a uniform slope.

It should be noted that some etching residues (not shown for clarity) may be left after the opening-etching process. The etching residue may be the remaining substances on the inner surface of the opening 400 after the opening-etching process. The etching residues may have different constitutions depending on the material to be etched. The etching residues may have adverse effects to the yield and/or reliability of the resulting semiconductor device 1A. A cleaning process may be performed to remove such etching residues. However, a conventional cleaning process employing diluted hydrogen fluoride may cause undercut of the bottom contact 105 which may result in electron migration during the following deposition for the opening 400. As a result, the yield and/or reliability of the resulting semiconductor device 1A may be impacted.

In some embodiments, a pre-cleaning treatment may be performed before the cleaning process to reduce adverse effects (e.g., undercut of the bottom contact 105) of a conventional cleaning process.

treatment, the intermediate semiconductor device illustrated in FIG. 5 (after the opening-etching process) may be spun at a rate between about 10 rpm and about 2000 rpm or between about 100 rpm and 1000 rpm. A pre-cleaning solution may be sprayed onto the intermediate semiconductor device to cover the entire front side of the intermediate semiconductor device. Simultaneously to applying the pre-cleaning solution onto the front side of the intermediate semiconductor device, water or other suitable solution may be applied to the backside of the intermediate semiconductor device to clean the backside of the intermediate semiconductor device.

In some embodiments, the pre-cleaning solution may include chelating agent(s), corrosion inhibitor(s), amine fluoride, surfactant(s), or solvent. In some embodiments, the amine fluoride and the surfactant(s) may be optional.

Generally, the chelating agent(s) may be also known as complexing or sequestering agent(s). The chelating agent(s) may have negatively charged ions called ligands that bind with free metal ions and form a combined complex that remain soluble. The chelating agent(s) may be used to remove metallic ions from the intermediate semiconductor device. It is not bound to any particular theory, the chelating agent(s) may also reduce or avoid the underlying bottom contact 105 exposed through the opening 400 being corroded.

In some embodiments, the chelating agent(s) of the pre-cleaning solution may include ethylenediaminetetraacetic acid, polyacrylates, carbonates, phosphonates, gluconates, N,N'-bis(2-hydroxyphenyl)ethylenediiminodiacetic acid, triethylenetetranitrilohexaacetic acid, desferriferrioxamin B, N,N',N"-tris[2-(N-hydroxycarbonypethyl]-1,3,5-benzenetricarboxamide, and/or ethylenediaminediorthohydroxyphenylacetic acid. In some embodiments, the concentration of the chelating agent(s) may be between about 0.001 mg/L and about 300 mg/L or between about 0.01 mg/L and about 3 mg/L. In some embodiments, alternatively, the concentration of the chelating agent(s) may be between 1 ppm and about 400 ppm of the pre-cleaning solution or preferably about 40 ppm of the pre-cleaning solution.

The corrosion inhibitor(s) of the pre-cleaning solution may be provided to reduce or avoid the metal corrosion during the following cleaning process. In some embodiments, the corrosion inhibitor(s) may include an aliphatic alcohol compound having at least one mercapto group in the molecule. The number of carbon atoms constituting said alcohol compound is not less than 2, and a carbon atom bonded with a mercato group, and another carbon atom bonded with a hydroxyl group are contiguously bonded with each other. For example, the corrosion inhibitor(s) may be 2-mercaptoethanol and/or thioglycerol. In some embodiments, the concentration of the corrosion inhibitor(s) in the pre-cleaning solution may be between about 0.0001% and about 10% by weight or between about 0.001% and about 1% by weight. When the concentration is too low, the corrosion inhibiting effect may be limited to an unsatisfactory degree. Whereas too high concentration may not always give a further increased corrosion inhibiting effect and moreover may make it difficult to handle it due to the odor peculiar to mercapto group-carrying compounds.

Alternatively, in some embodiments, the corrosion inhibitor(s) of the pre-cleaning solution may include aromatic hydrocarbon compounds such as benzotriazole and/or 5-methylbenzimidazole. Alternatively, in some embodiments, the corrosion inhibitor(s) of the pre-cleaning solution may include uric acid, adenine, caffeine, and/or purine.

Alternatively, in some embodiments, the corrosion inhibitor(s) of the pre-cleaning solution may include glyoxylic. Due to the presence of glyoxylic acid, which is a reducing material, even if a metal material is exposed during the pre-cleaning treatment, by controlling the redox potential of the pre-cleaning solution by adjusting the concentration of glyoxylic acid therein, electron transfer between the pre-cleaning solution and the exposed metal material is controlled, and corrosion of the metal material is prevented.

Alternatively, in some embodiments, the corrosion inhibitor(s) of the pre-cleaning solution may include 2-mercapto-ethanol, thioglycerol, benzotriazole, 5-methylbenzimidazole, uric acid, adenine, caffeine, purine, and/or glyoxylic acid.

In some embodiments, the amine fluoride of the pre-cleaning solution may include methylamine hydrofluoride, ethylamine hydrofluoride, propylamine hydrofluoride, tetramethylammonium fluoride, tetraethylammonium fluoride, ethanolamine hydrofluoride, methylethanolamine hydrofluoride, dimethylethanolamine hydrofluoride, and/or triethylenediamine hydrofluoride. The amine fluoride may be used to remove the etching residues.

In some embodiments, the concentration of the amine fluoride in the pre-cleaning solution may be determined according to the composition of the etching residues. For example, the concentration of the amine fluoride may be between about 0.1 mass % and about 5 mass % of the entire composition of the pre-cleaning solution, or between about 0.2 mass % and about 3 mass % of the entire composition of the pre-cleaning solution. By setting the concentration of the amine fluoride in such a range, it is possible to ensure that the amine fluoride in the pre-cleaning solution is capable of removing the etching residues, while preventing the amine fluoride from corroding underlying metal material (of the bottom contact 105) exposed through the opening 400 and suppressing etching of underlying dielectric layer exposed through the opening 400. That is, if the concentration of the amine fluoride in the pre-cleaning solution is too low, the ability to remove a residue is low, and if the concentration is too high, the metal material may be corroded, and the exposed dielectric layer may be etched or undergo structural change.

The purpose of the surfactant(s) may be to prevent reattachment or redeposition of particles on the intermediate semiconductor device after they have been dislodged from the intermediate semiconductor device. Preventing the reattachment of the particles is important because allowing the particles to reattach increases overall process time. The purpose of the surfactant(s) may also include imparting affinity toward a water-repellent material layer. Generally, surfactant(s) are long hydrocarbon chains that typically contain a hydrophilic (polar water-soluble group) and a hydrophobic group (a non-polar water-insoluble group). The surfactant(s) attach with their non-polar group to particles as well as to the front side of the intermediate semiconductor device. As a result, the polar group of the surfactant(s) will point away from the wafer and away from the particles towards the pre-cleaning solution covering the front side of the intermediate semiconductor device. Because of this the particles in the solution that are bound by the surfactant will be repelled electrostatically from the front side of the intermediate semiconductor device due to the polar groups of the surfactant(s) on both the particles and the front side of the intermediate semiconductor device.

In some embodiments, the surfactant(s) of the pre-cleaning solution may include non-ionic, anionic, or a mixture of non-ionic and anionic compounds. Non-ionic means that the polar end of the surfactant has an electrostatic rather than an ionic charge and anionic means that the polar end of the surfactant has a negative ionic charge. The nonionic surfactant may be, for example, polyoxyethylene butylphenyl ether and the anionic surfactant may be, for example, polyoxyethylene alkylphenyl sulfate. In some embodiments, the concentration of the surfactant(s) of the pre-cleaning solution may be between about 1 ppm and about 100 ppm. In some embodiments, the concentration of the non-ionic surfactant(s) in the pre-cleaning solution may be about 30 ppm and the concentration of the anionic surfactant(s) in the pre-cleaning solution may be about 30 ppm. In some embodiments, the concentration of the surfactant(s) of the pre-cleaning solution may be between 0.0001 mass % and 10 mass % of the entire composition of the pre-cleaning solution, or between about 0.001 mass % and about 5 mass % of the entire composition of the pre-cleaning solution. By setting the concentration in such a range, it is possible to ensure that the wettability toward the front side of the intermediate semiconductor device is commensurate with the concentration of the surfactant(s).

In some embodiments, the solvent of the pre-cleaning solution may be deionized water.

In some embodiments, the front side of the intermediate semiconductor device illustrated in FIG. 5 may be covered (or immersed) by the pre-cleaning solution for about 2 minutes. Next, the intermediate semiconductor device may be rinsed using deionized water to remove the pre-cleaning solution.

In some embodiments, a drying process may be performed after the pre-cleaning treatment. The drying process may be performed by spinning between about 100 rpm and about 6000 rpm, or about 3000 rpm, for about 20 seconds and using the air flow to dry the intermediate semiconductor device. In some embodiments, nitrogen or isopropyl alcohol may be used to facilitate the dry process. In some embodiments, the dry process may be optional. That is, the cleaning process may be directly performed after the rinsing of the pre-cleaning solution.

Conventionally, the cleaning process may be performed solely using diluted hydrofluoric acid without any pre-cleaning treatment. The underlying bottom contact 105 may be damaged to cause profile defects (e.g., undercuts) or electron migration after filling conductive material into the opening 400. In contrast, in the present embodiment, the underlying bottom contact 105 may be protected by the chelating agent(s) and/or the corrosion inhibitor(s) contained in the pre-cleaning solution. As a result, the profile defects or electron migration may be reduced or avoided. Accordingly, the yield and the reliability of the resulting semiconductor device 1A may be improved.

Figure 6:
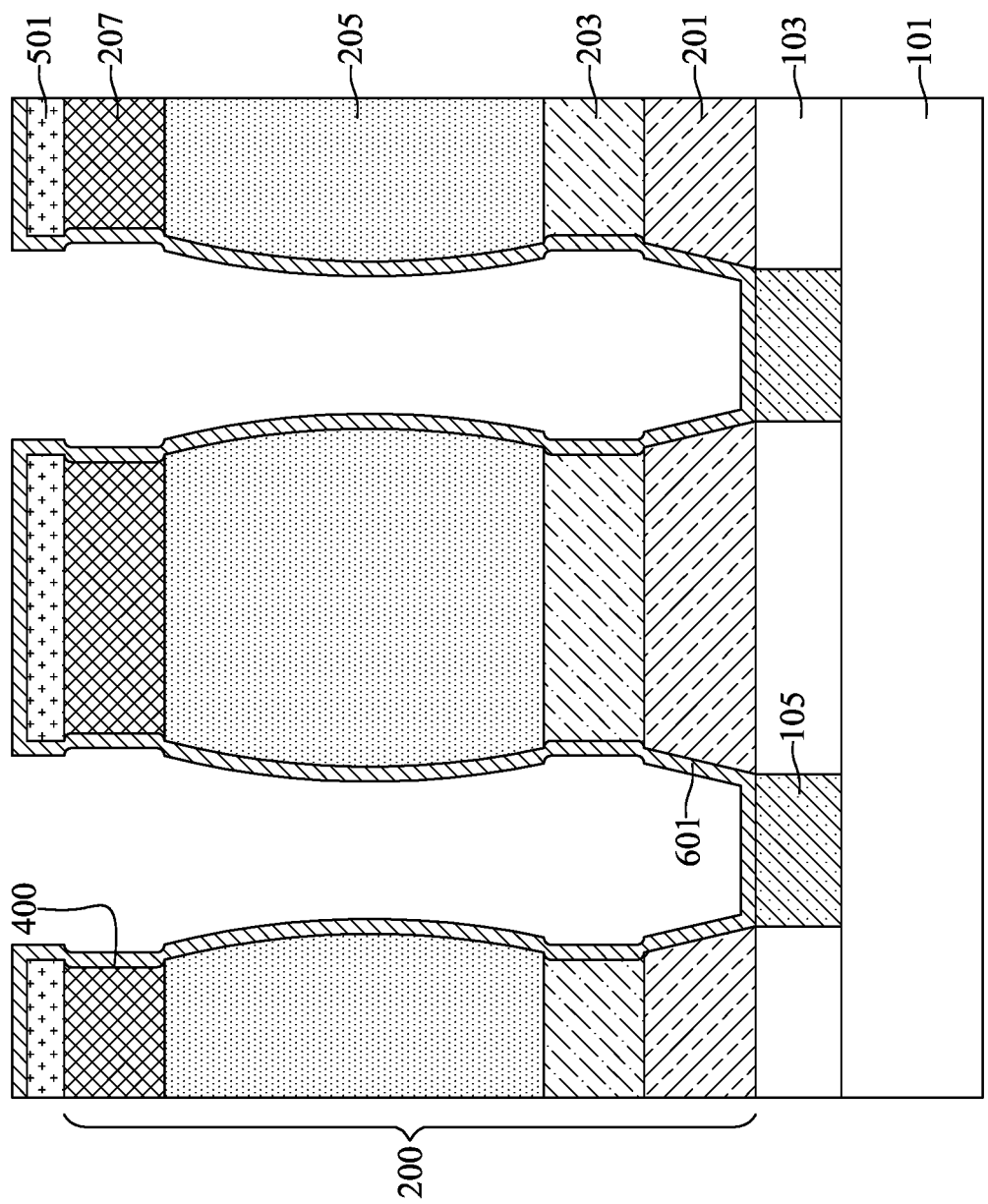
Figure 7:
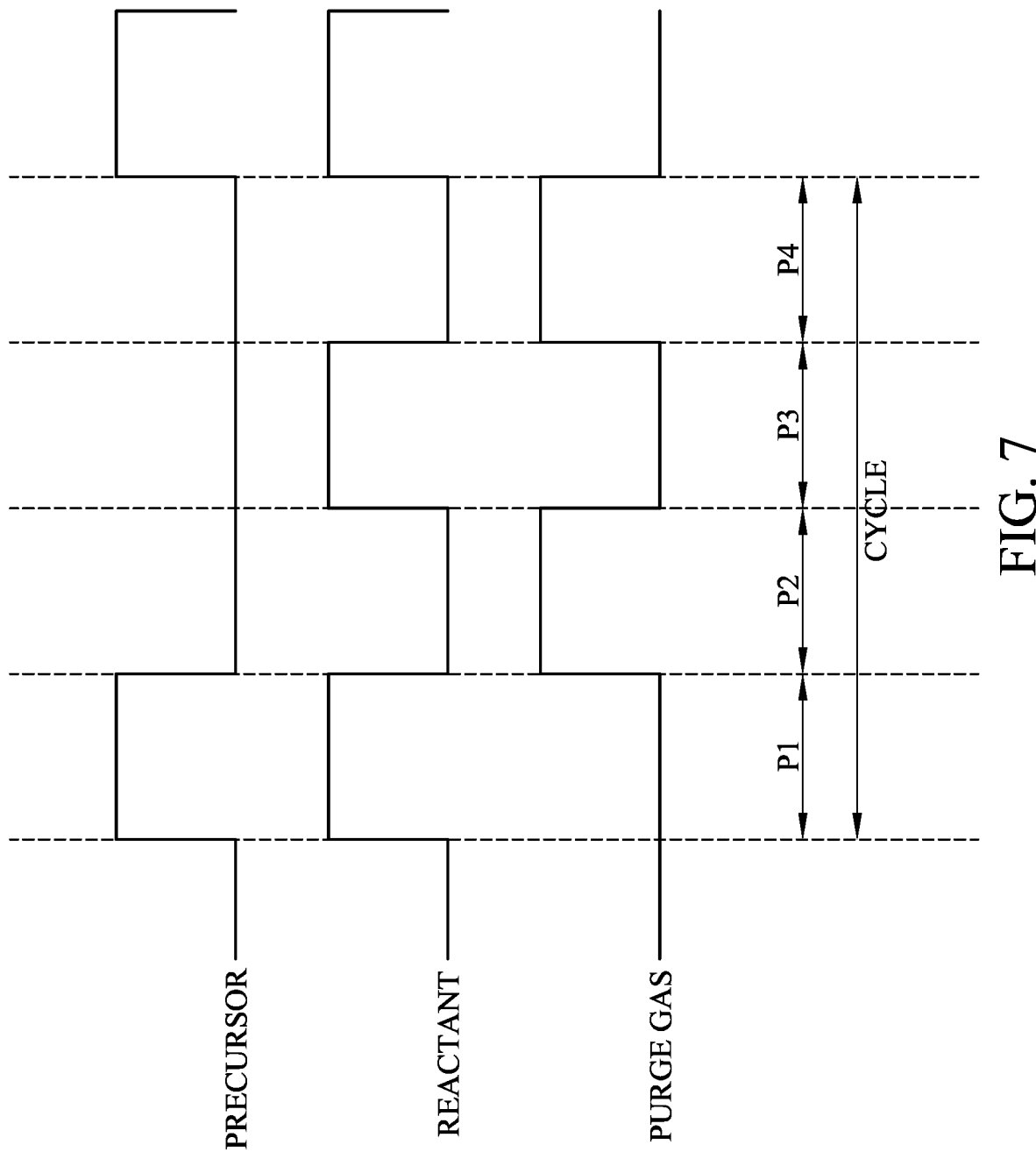
FIG. 7 is a chart showing an example of process conditions for forming a first barrier layer in accordance with one embodiment of the present disclosure.

With reference to FIGS. 1, 6, and 7, at step S17, a first barrier layer 601 may be conformally formed in the plurality of openings 400.

With reference to FIGS. 6 and 7, the first barrier layer 601 may be formed by chemical vapor deposition (also referred to as the first chemical vapor deposition process). Detailedly, the formation of the first barrier layer 601 may include a source gas introducing step, a first purging step, a reactant flowing step, and a second purging step. The source gas introducing step, the first purging step, the reactant flowing step, and the second purging step may be referred to as one cycle. Multiple cycles may be performed to obtain the desired thickness of the first barrier layer 601.

For example, the intermediate semiconductor device illustrated in FIG. 5 (after the pre-cleaning process and the cleaning process) may be loaded in a reaction chamber. In the source gas introducing step, during a period P1, source gases containing a precursor and a reactant may be introduced to the reaction chamber. The precursor and the reactant may diffuse across a boundary layer and reach the surface of the intermediate semiconductor device illustrated in FIG. 5 (i.e., the top surface of the hard mask layer 501 and the inner surfaces of the openings 400). The precursor and the reactant may adsorb on and subsequently migrate on the surface aforementioned. The adsorbed precursor and the adsorbed reactant may react on the surface aforementioned and form solid byproducts. The solid byproducts may form nuclei on the surface aforementioned. The nuclei may grow into islands and the islands may merge into a continuous thin film on the surface aforementioned. In the first purging step, during a period P2, a purge gas such as argon may be injected into the reaction chamber to purge out the gaseous byproducts, unreacted precursor, and unreacted reactant.

In the reactant flowing step, during a period P3, the reactant may be solely introduced to the reaction chamber to turn the continuous thin film into the first barrier layer 601. In the second purging step, during a period P4, a purge gas such as argon may be injected into the reaction chamber to purge out the gaseous byproducts and unreacted reactant.

In some embodiments, the precursor may be titanium tetrachloride. The reactant may be ammonia. Titanium tetrachloride and ammonia may react on the surface and form a titanium nitride film including high chloride contamination due to incomplete reaction between titanium tetrachloride and ammonia. The ammonia in the reactant flowing step may reduce the chloride content of the titanium nitride film. After the ammonia treatment, the titanium nitride film may be referred to as the first barrier layer 601.

In some embodiments, the formation of the first barrier layer 601 using the chemical vapor deposition may be performed with the assistance of plasma. The source of the plasma may be, for example, argon, hydrogen, or a combination thereof.

It should be noted that the first barrier layer 601 formed by the first chemical vapor deposition may have relatively large grain size as compared to a layer formed by an atomic layer deposition process. As a result, the conductivity of the first barrier layer 601 formed by the first chemical vapor deposition may be improved.

Figure 8:
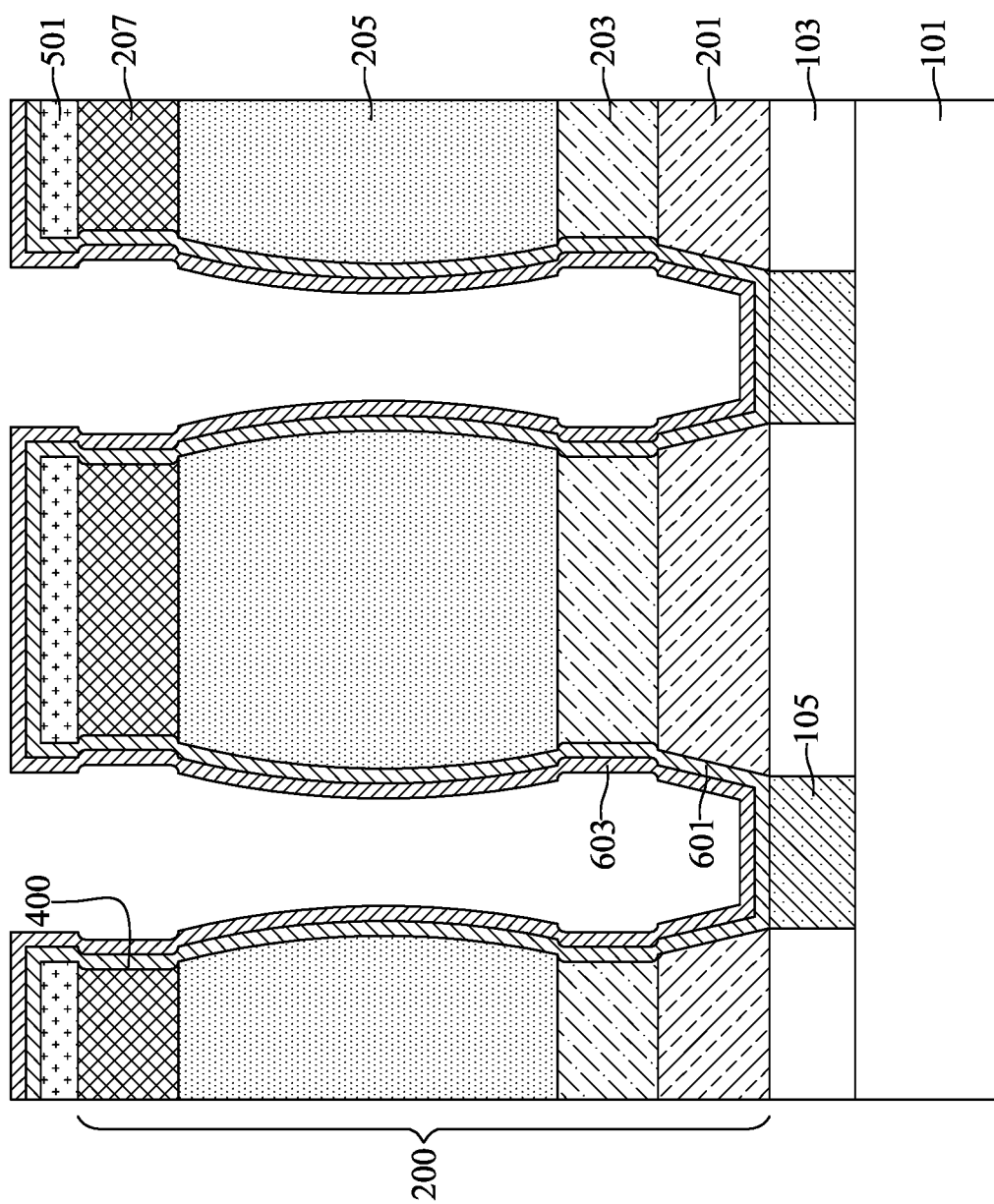
FIG. 8 illustrates, in a schematic cross-sectional view diagram, part of the flow for fabricating the semiconductor device in accordance with one embodiment of the present disclosure.
Figure 9:
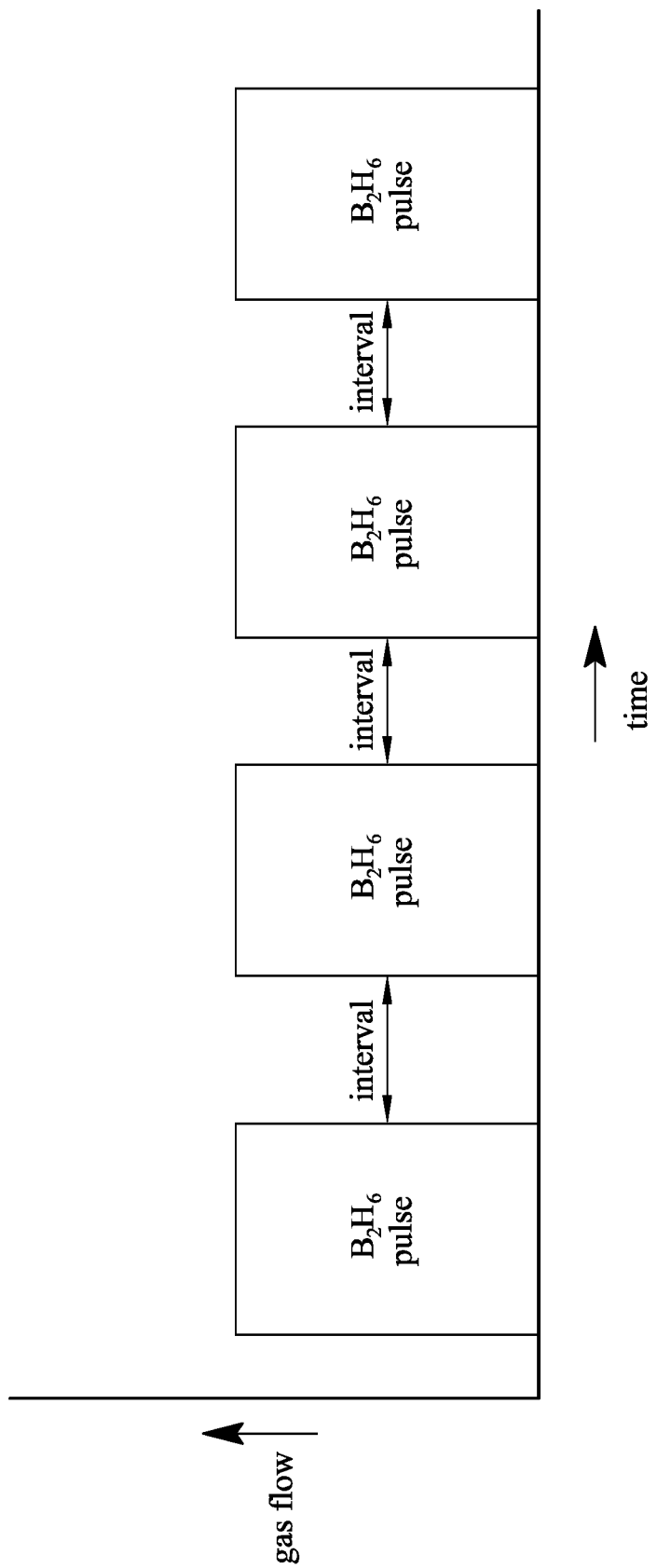
FIG. 9 is a graph representing reducing agent pulses and interval times of a post-treatment in accordance with one embodiment of the present disclosure.
Figure 10:
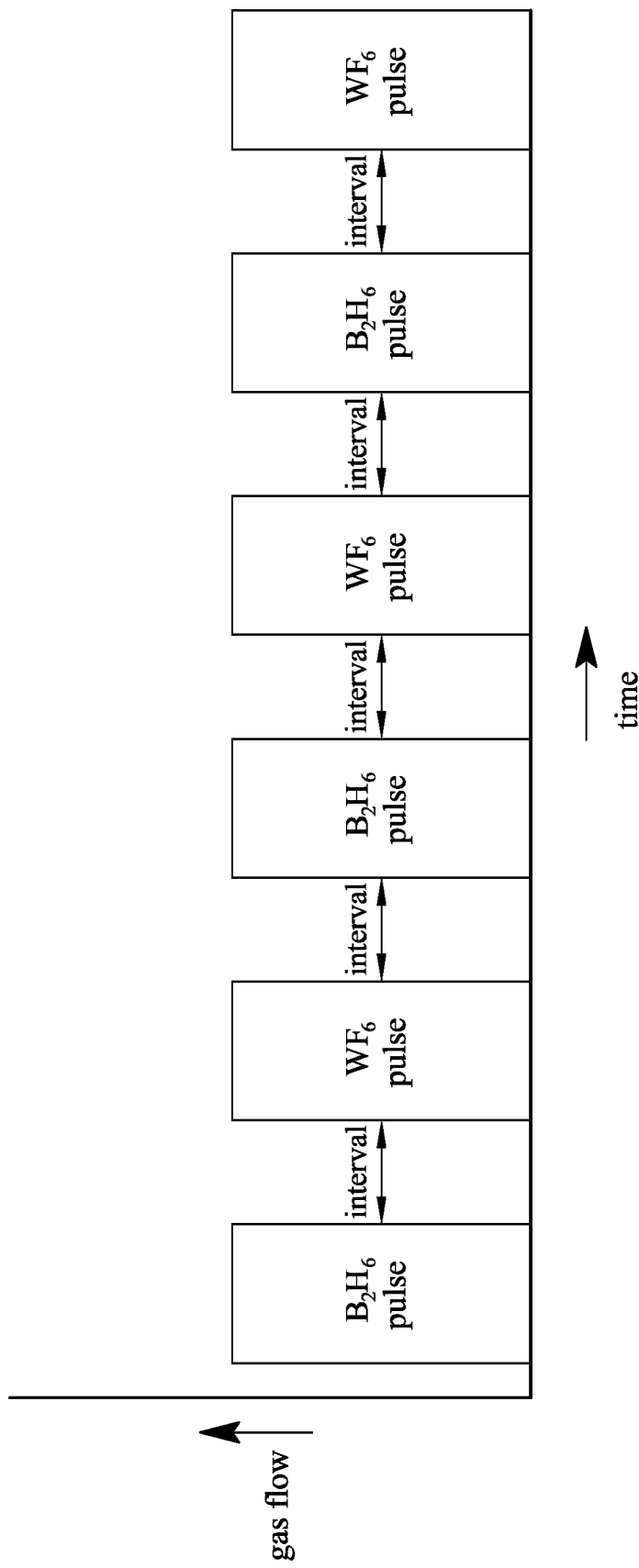
FIG. 10 is a graph representing reducing agent pulses and interval times of a post-treatment in accordance with another embodiment of the present disclosure.
Figure 11:
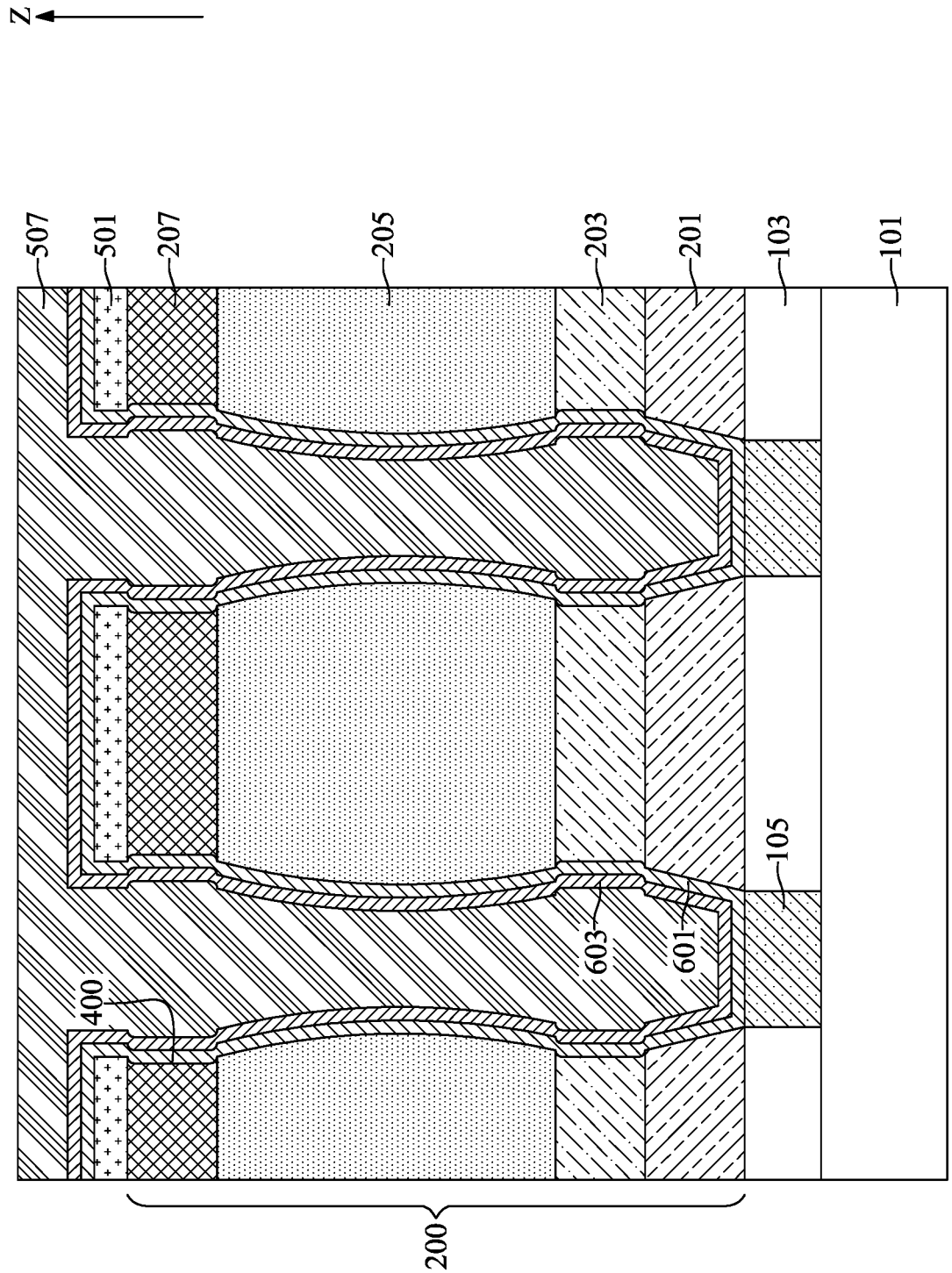
FIGS. 11 and 12 illustrate, in schematic cross-sectional view diagrams, part of the flow for fabricating the semiconductor device in accordance with one embodiment of the present disclosure.
Figure 12:
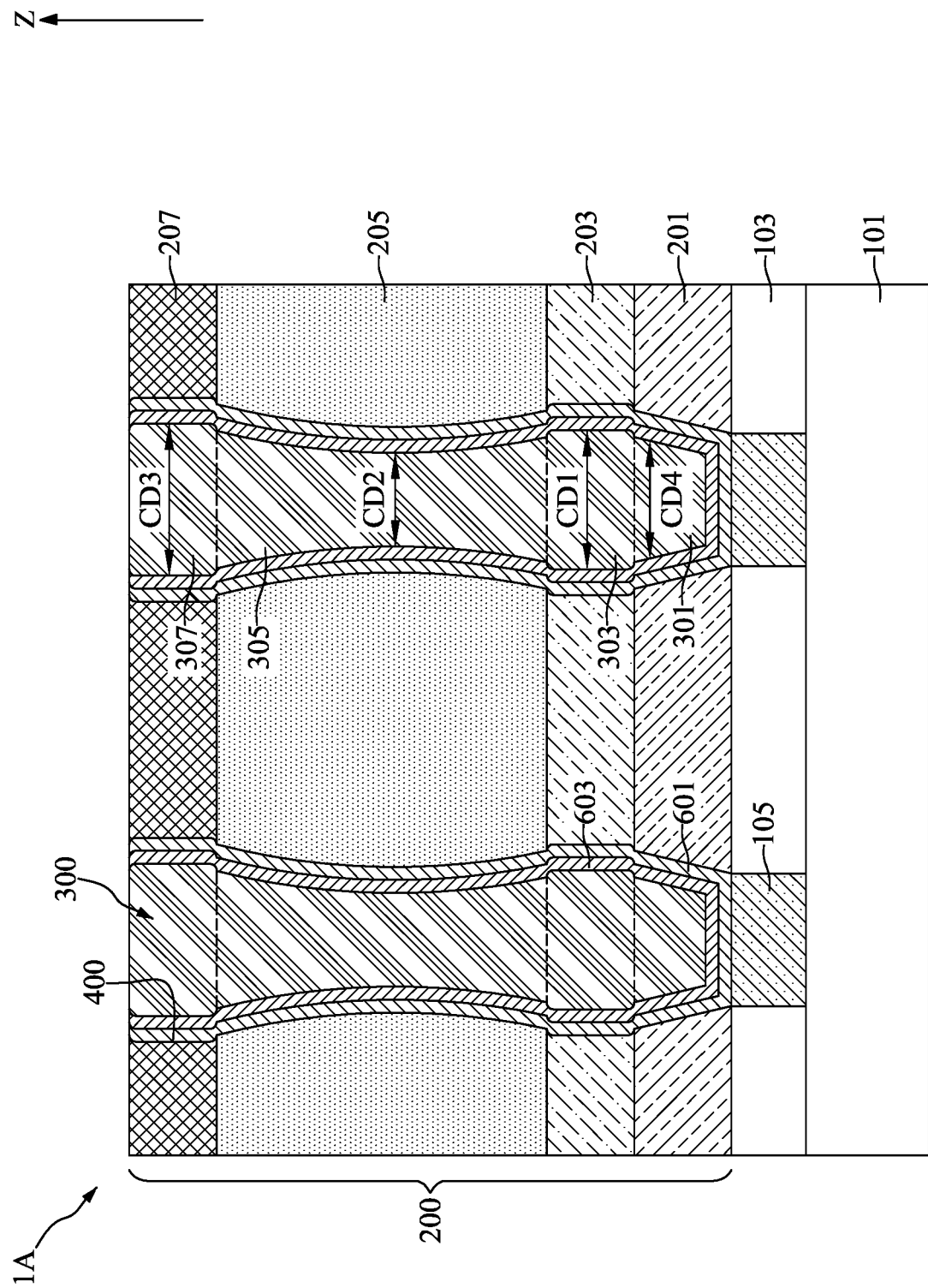

FIG. 8 illustrates, in a schematic cross-sectional view diagram, part of the flow for fabricating the semiconductor device 1A in accordance with one embodiment of the present disclosure. FIG. 9 is a graph representing reducing agent pulses and interval times of a post-treatment in accordance with one embodiment of the present disclosure. FIG. 10 is a graph representing reducing agent pulses and interval times of a post-treatment in accordance with another embodiment of the present disclosure. The vertical axis represents gas flow rate, and the horizontal axis represents time. FIGS. 11 and 12 illustrate, in schematic cross-sectional view diagrams, part of the flow for fabricating the semiconductor device 1A in accordance with one embodiment of the present disclosure.

With reference to FIG. 1 and FIGS. 8 to 12, at step S19, a second barrier layer 603 may be conformally formed on the first bather layer 601 and a plurality of conductive structures 300 may be formed in the plurality of openings 400.

With reference to FIG. 8, the second barrier layer 603 may be conformally formed on the second barrier layer 603 and in the plurality of openings 400. In some embodiments, the second barrier layer 603 may be formed of, for example, copper, a copper alloy, silver, gold, tungsten, aluminum, nickel, or the like. In the present embodiment, the second barrier 603 is formed of tungsten.

With reference to FIG. 8, the second barrier layer 603 may be formed by, for example, a pulsed nucleation layer method (also referred to as the second chemical vapor deposition process). Generally, in the pulsed nucleation layer method, pulses of reactant (e.g., reducing agent or precursor) may be sequentially injected and purged from the reaction chamber, typically by a pulse of a purge gas between reactants. A first reactant may be adsorbed onto the substrate (e.g., the first barrier layer 601), available to react with the next reactant (e.g., the second reactant). The process is repeated in a cyclical fashion (also referred to as the deposition cycles) until the desired thickness is achieved.

It should be noted that the pulsed nucleation layer method may be generally distinguished from atomic layer deposition by its higher operating pressure range (greater than 1 Torr) and its higher growth rate per cycle (greater than 1 monolayer film growth per cycle). The chamber pressure during the pulsed nucleation layer method may range from about 1 Torr to about 400 Torr.

For example, the deposition cycles of the second chemical vapor deposition process may include pulses of a silicon-containing reducing agent and pulses of a tungsten-containing precursor. The first barrier layer 601 may be initially exposed to the pulse of the silicon-containing reducing agent and followed by exposure to the pulse of the tungsten-containing precursor. The exposure to the pulse of the silicon-containing reducing agent and the pulse of the tungsten-containing precursor may be defined as one deposition cycle. The deposition cycle may be repeated until the desired thickness of the second barrier layer 603 is achieved. By increasing repeating times of the deposition cycles of the second chemical vapor deposition process, the sidewall coverage of the second barrier layer 603 may be better, and may have less overhang at the top ends of the opening 400.

Silane and related compounds have been found to adsorb well to metal nitride surfaces such as titanium nitride and tungsten nitride used as barrier layer materials in some integrated circuit applications. Any suitable silane or silane derivative may be used as the silicon-containing reducing agent, including organic derivatives of silanes. It is generally understood that silanes adsorb on the substrate surface in a self-limiting manner to create nominally a monolayer of silane species. Thus, the amount of adsorbed species is largely independent of the silane dosage.

In some embodiments, the substrate temperature during the exposure to the pulses of the silicon-containing reducing agent of the deposition cycles may be between about 200° C. and about 475° C., between about 300° C. and about 400° C., or about 300° C. In some embodiments, the chamber pressure during exposure to the pulses of the silicon-containing reducing agent of the deposition cycles may be between about 1 Torr and about 350 Torr or be fixed around 40 Torr. The exposure time (or pulse time) may vary depending in part upon dosages and chamber conditions. In some embodiments, the first barrier layer 601 is exposed until the surface is sufficiently and evenly covered with at least a saturated layer of silane species. In some embodiments, the silicon-containing reducing agent may be provided alone. In some embodiments, the silicon-containing reducing agent may be provided with a carrier gas such as argon or argon-hydrogen mixtures.

Once the first barrier layer 601 is sufficiently covered with silane species, the pulses of the silicon-containing reducing agent may be stopped. A purge process may be performed to clear residual gas reactants near the surface of the first barrier layer 601. The purge process may be performed with a carrier gas such as argon, hydrogen, nitrogen, or helium.

In some embodiments, the tungsten-containing precursor may include tungsten hexafluoride, tungsten hexachloride, or tungsten hexacarbonyl. In some embodiments, the tungsten-containing precursor may include organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor may be provided in a dilution gas, accompanying with gases such as argon, nitrogen, hydrogen, or a combination thereof.

In some embodiments, the substrate temperature during exposure to the pulses of the tungsten-containing precursor of the deposition cycles may be between about 200° C. and about 475° C., between about 300° C. and about 400° C., or about 300° C. In some embodiments, the chamber pressure during exposure to the pulses of the tungsten-containing precursor of the deposition cycles may be between about 1 Torr and about 350 Torr. Tungsten-containing precursor dosage and substrate exposure time (or pulse time) will vary depending upon many factors. In general, the exposure may be performed until the adsorbed silane species is sufficiently consumed by reaction with the tungsten-containing precursor to produce the second barrier layer 603. Thereafter, the pulses of the tungsten-containing precursor may be stopped, and a purge process may be performed with a carrier gas such as argon, hydrogen, nitrogen, or helium.

Conventionally, an additional layer may be formed using atomic layer deposition to improve the sidewall coverage of the second barrier layer 603. In contrast, in the present embodiment, the sidewall coverage may be improved by increasing repeating times of the deposition cycles of the second chemical vapor deposition process. Therefore, the additional layer is not required. As a result, the complexity and the cost of fabricating the semiconductor device 1A may be reduced.

In some embodiments, the second chemical vapor deposition process may include performing an initial deposition step before the deposition cycles of the pulsed nucleation layer method (i.e., the second chemical vapor deposition). In some embodiments, the initial deposition step may include providing a borane-containing precursor pulse and a subsequent tungsten-containing precursor pulse, each followed by a purge pulse. In some embodiments, the borane-containing precursor of the initial deposition step may be, for example, borane, diborane, triborane, or boron halides (e.g., $BF_3$, $BCl_3$) with hydrogen. In some embodiments, the borane-containing precursor of the initial deposition step may be provided in a dilution gas, accompanied with gases such as argon, nitrogen, hydrogen, silane, or a combination thereof. For example, diborane may be provided from a diluted source (e.g., 5% diborane and 95% nitrogen).

In some embodiments, the substrate temperature during the borane-containing precursor pulse of the initial deposition step may be between about 200° C. and about 475° C., between about 300° C. and about 400° C., or about 300° C. In some embodiments, the chamber pressure during the borane-containing precursor pulse of the initial deposition step may be between about 1 Torr and about 350 Torr.

In some embodiments, the tungsten-containing precursor of the initial deposition step may include tungsten hexafluoride, tungsten hexachloride, or tungsten hexacarbonyl, or organo-metallic compounds that are free of fluorine, such as MDNOW (methylcyclopentadienyl-dicarbonylnitrosyl-tungsten) and EDNOW (ethylcyclopentadienyl-dicarbonylnitrosyl-tungsten). In some embodiments, the tungsten-containing precursor of the initial deposition step may be provided in a dilution gas, accompanying with gases such as argon, nitrogen, hydrogen, or a combination thereof.

In some embodiments, the substrate temperature during exposure to the tungsten-containing precursor may be between about 200° C. and about 475° C., between about 300° C. and about 400° C., or about 300° C. In some embodiments, the chamber pressure during exposure to the tungsten-containing precursor may be between about 1 Torr and about 350 Torr.

With reference to FIG. 9, in some embodiments, after the formation of the second barrier layer 603, a post-treatment may be performed to the second barrier layer 603. During the post-treatment, the second barrier layer 603 may be exposed to one or more pulses of reducing agent(s) prior to forming a subsequently conductive layer on the second barrier layer 603. Exposure to the reducing agent pulse(s) may improve the resistivity of the overall structure including the second barrier layer 603 and the subsequently conductive layer which will be illustrated layer.

With reference to FIG. 9, the second barrier layer 603 may be exposed to multiple reducing agent pulses with interval times between the pulses. During an interval time, no reducing agent flows to the second barrier layer 603. In some embodiments, the reducing agent may be diborane, though other reducing agents may be used. In some embodiments, the flow rate of the reducing agent during a pulse is between about 100 standard cubic centimeters per minute (sccm) and 500 sccm. In some embodiments, the pulse time (or duration of pulse) of each reducing agent pulse may be between about 0.5 seconds and about 5 seconds, or between about 1 seconds and 2 seconds. In some embodiments, the number of reducing agent pulses may be between 2 and 8. In some embodiments, the process pressure of the post-treatment may be between about 2 Torr and about 100 Torr, or between about 20 Torr and about 40 Torr.

In some embodiments, the reducing agent may be provided in a dilution gas, accompanied with gases such as argon, nitrogen, hydrogen, silane, or a combination thereof. For example, diborane may be provided from a diluted source (e.g., 5% diborane and 95% nitrogen). In some embodiments, an inert gas/hydrogen gas mixture may continuously flow to the second barrier layer 603 during both the reducing agent pulses and the interval times of the post-treatment. In some embodiments, the inert gas may be argon. In contrast, no other gases, other than a continuously flowing inert gas/hydrogen mixture or other background gas, flow to the second barrier layer 603 during the interval times of the post-treatment, i.e., there are no intervening pulse operations during the interval time between the reducing agent pulses.

In some embodiments, the intermediate semiconductor device illustrated in FIG. 8 may be pre-heated to between about 375° C. and about 415° C., or about 395° C. to stabilize before the post-treatment. In some embodiments, the intermediate semiconductor device after the post-treatment may be heated to between about 375° C. and about 415° C., or about 395° C. The preheat process before exposing the post-treatment and the thermal treatment after the post-treatment may enhance film adhesion and improve sheet resistance percent non-uniformity.

In some embodiments, the second barrier layer 603 may be exposed to an additional tungsten-containing precursor after the post-treatment to form an additional portion of the second barrier layer 603 before depositing the subsequently conductive layer on the second barrier layer 603. Any suitable tungsten containing precursor may be used. For example, the tungsten-containing precursor may include tungsten hexafluoride, tungsten hexachloride, or tungsten hexacarbonyl. The tungsten-containing precursor may be provided in a dilution gas accompanying with gases such as argon, nitrogen, hydrogen, or a combination thereof.

With reference to FIG. 10, alternatively, in some embodiments, the second barrier layer 603 may be alternatively exposed to multiple pulses of reducing agents with interval times between the pulses. During an interval, no reducing agent flows to the second barrier layer 603. In some embodiments, the reducing agents such as diborane and a tungsten-containing precursor may alternatively flow (or introduce) to the second barrier layer 603.

In some embodiments, the flow rate of the diborane may be between about 100 sccm and about 500 sccm, or about 300 sccm. In some embodiments, the tungsten-containing precursor may include, for example, tungsten hexafluoride, tungsten hexachloride, or tungsten hexacarbonyl. The flow rate of the tungsten-containing precursor may be between about 100 sccm and about 500 sccm, or about 100 sccm. In some embodiments, the pulse time (or duration of pulse) may be between about 0.5 seconds and 5 seconds, or between about 1 seconds and 2 seconds. In some embodiments, the interval time between each pulse may be between about 2 seconds and about 5 seconds. In some embodiments, the number of pulses may be between 2 and 8. In some embodiments, the chamber pressure may be between about 2 Torr and about 100 Torr, or between about 20 Torr and about 40 Torr.

In some embodiments, the pulse time should be short enough to ensure that no or substantially no tungsten deposits. In some embodiments, the amount of the tungsten-containing precursor applied to the second barrier layer 603 during the post-treatment may be less than the amount of tungsten-containing precursor applied to the first barrier layer 601 during forming the second barrier layer 603. In some embodiments, the pulse time of the tungsten-containing precursor applied to the second barrier layer 603 during the post-treatment may be less than the pulse time of tungsten-containing precursor applied to the first barrier layer 601 during forming the second barrier layer 603.

In certain embodiments, the reducing agent and tungsten-containing precursor pulses may be as short as less than 1 second. In one example, diborane ($B_2H_6$) may be pulsed for 1 second, followed by a 1 second purge, followed by a tungsten hexafluoride ($WF_6$) pulse of 1 second, followed by a 2.5 second purge. This cycle is then repeated four times.

No bound by a particular theory, it is believed that the introduction of the tungsten hexafluoride pulses between diborane pulses may help scavenge unreacted diborane, which otherwise promotes the onset of micropeeling, from the surface of the second barrier layer 603.

In some embodiments, the post-treatment may be performed between about 10 seconds and about 50 seconds, or between about 10 seconds and about 30 seconds. Longer post-treatment time (or duration) may induce decomposition of diborane which has an adverse effect on the resistivity of the subsequent conductivity layer.

In some embodiments, an etching process may be performed after formation of the second barrier layer 603 to remove overhang of the second barrier layer 603 (if any) at the top ends of the opening 400. In some embodiments, the etching process may be an anisotropic etching process. In some embodiments, the etching process may be performed before the post-treatment. In some embodiments, the etching process may be performed after the post-treatment.

With reference to FIG. 11, a layer of conductive material 507 may be formed on the second barrier layer 603 and completely fill the plurality of openings 400. In some embodiments, the conductive material 507 may be the same material as the second barrier layer 603 (e.g., tungsten). The layer of conductive material 507 may be formed by, for example, physical vapor deposition, atomic layer deposition, molecular layer deposition, chemical vapor deposition, in-situ radical assisted deposition, metalorganic chemical vapor deposition, molecular beam epitaxy, sputtering, plating, evaporation, ion beam deposition, electron beam deposition, laser assisted deposition, chemical solution deposition, or any combination thereof. In the present embodiment, the layer of conductive material 507 is formed by chemical vapor deposition (also referred to as the third chemical vapor deposition).

In some embodiments, the third chemical vapor deposition may include an initial deposition step, deposition cycles, and a bulk step. The initial deposition step of the third chemical vapor deposition may be performed with a procedure similar to the initial deposition step of the second chemical vapor deposition illustrated in FIG. 8, and descriptions thereof are not repeated herein. The deposition cycles of the third chemical vapor deposition may be performed with a procedure similar to the deposition cycles of the second chemical vapor deposition illustrated in FIG. 8, and descriptions thereof are not repeated herein. The bulk step of the third chemical vapor deposition may include flowing (or introducing) a tungsten-containing precursor and a co-reactant such as a reducing agent to the intermediate semiconductor device including the second barrier layer 603. Example process pressure of the bulk step of the third chemical vapor deposition may be between about 10 Torr and about 500 Torr. Example substrate temperature of the bulk step of the third chemical vapor deposition may be between about 250° C. and about 495° C. The tungsten-containing precursor of the bulk step of the third chemical vapor deposition may be, for example, tungsten hexafluoride, tungsten chloride, or tungsten hexacarbonyl. The reducing agent of the bulk step of the third chemical vapor deposition may be, for example, hydrogen gas, silane, disilane, hydrazine, diborane, or germane. By including the bulk step rather than relying on the deposition cycles, the opening 400 may be filled up in a shorter time.

Since the second barrier layer 603 formed by using the second chemical vapor deposition can provide good sidewall coverage, the subsequently formed layer of conductive material 507 can fill up the opening 400 without a void sealed therein. Therefore, the layer of conductive material 507 can be formed with improved conductivity.

In some embodiments, the repeat times of the deposition cycles of the third chemical vapor deposition may be less than the repeat times of the deposition cycles of the second chemical vapor deposition. In some embodiments, the repeat times of the deposition cycles of the third chemical vapor deposition and the repeat times of the deposition cycles of the second chemical vapor deposition may be the same or substantially the same.

In some embodiments, the grain size of tungsten of the layer of conductive material 507 may be greater than 30 nm, than 50 nm, than 70 nm, than 80 nm, than 85 nm, or than 87 nm. In some embodiments, the layer of conductive material 507 may include alpha phase tungsten.

With reference to FIG. 12, a planarization process, such as chemical mechanical polishing, may be performed until the top surface of the top dielectric layer 207 is exposed to remove excess material and provide a substantially flat surface for subsequent processing steps. After the planarization process, the remaining conductive material 507 in the plurality of openings 400 may be referred to as the plurality of conductive structures 300. For brevity, clarity, and convenience of description, only one conductive structure 300 is described.

With reference to FIG. 12, the conductive structure 300 may include a bottom portion 301 in the bottom dielectric layer 201, a lower middle portion 303 in the lower middle dielectric layer 203 and on the bottom portion 301, a higher middle portion 305 in the higher middle dielectric layer 205 and on the lower middle dielectric layer 203, and a top portion 307 in the top dielectric layer 207 and on the higher middle portion 305.

It should be noted that the shape of the conductive structure 300 may be determined by the opening 400. For example, the top dielectric layer 207 or the lower middle dielectric layer 203 may include expanded sidewall profiles. The higher middle portion 305 may include the hyperbola-like sidewall profile. The bottom portion 301 may include tapered sidewall profile. Accordingly, the critical dimension CD2 of the higher middle portion 305 may be less than the critical dimension CD1 of the lower middle portion 303 or the critical dimension CD3 of the top portion 307. The critical dimension CD4 of the bottom portion 301 may be less than the critical dimension CD1 of the lower middle portion 303. In some embodiments, the critical dimension CD1 of the lower middle portion 303 and the critical dimension CD3 may be substantially the same. In some embodiments, the critical dimension CD1 of the lower middle portion 303 and the critical dimension CD3 may be different. Due to the small critical dimension CD2 of the higher middle portion 305, distance between adjacent higher middle portions 305 may be increased. As a result, the parasitic capacitance of adjacent conductive structures 300 may be reduced.

In some embodiments, the critical dimension CD2 of the higher middle portion 305 may be less than the critical dimension CD4 of the bottom portion 301. In some embodiments, the critical dimension CD2 of the higher middle portion 305 and the critical dimension CD4 of the bottom portion 301 may be substantially the same.

By employing different carbon concentrations for different layers of the insulating stack 200, the critical dimensions can be controlled even using the same etching chemistry for different layers of the insulating stack 200. As a result, the overlay of the conductive structure 300 to the bottom contact 105 may be improved while the parasitic capacitance originating from adjacent conductive structures 300 is kept low.

Figure 13:
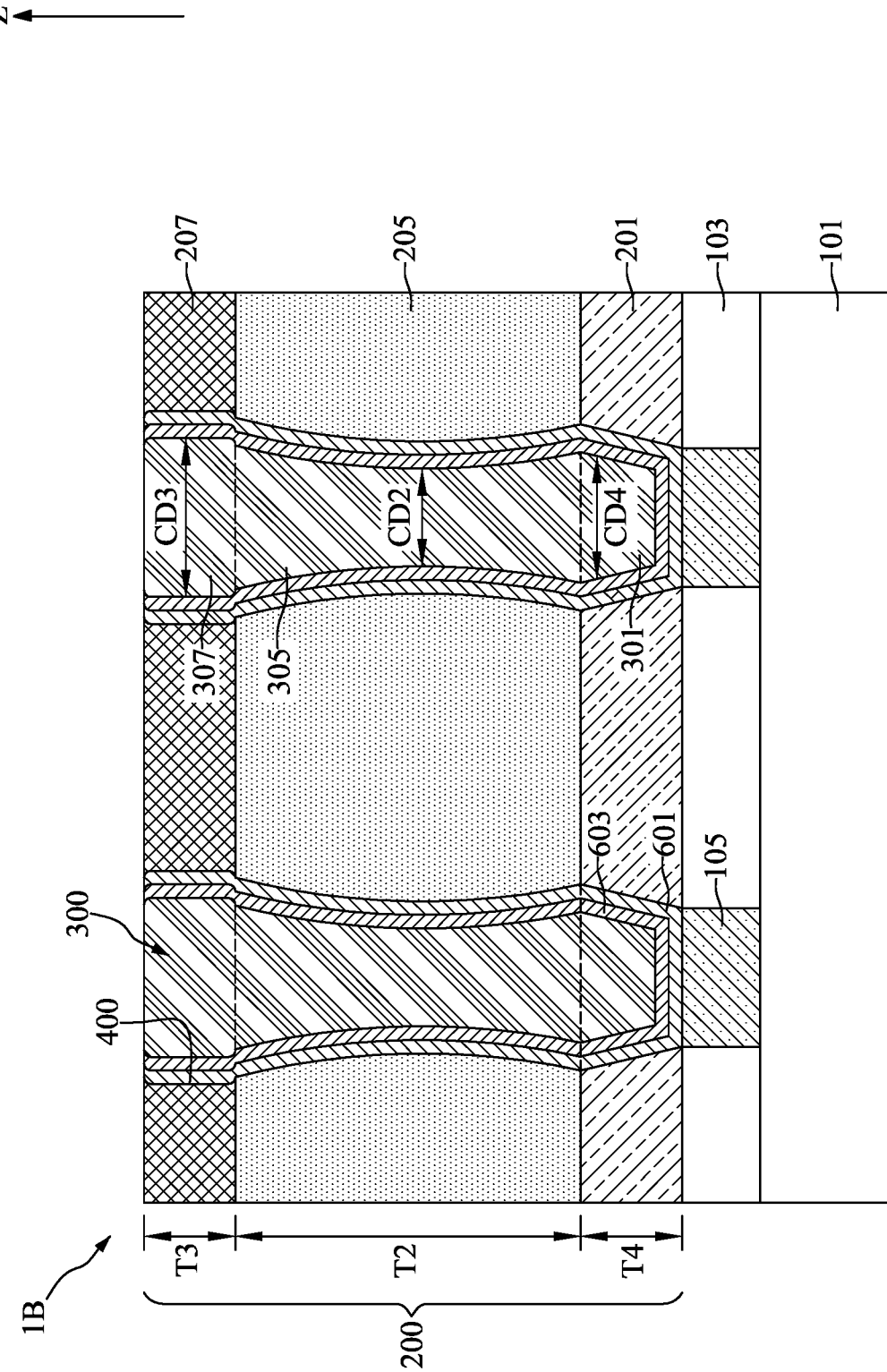
FIG. 13 illustrates, in a schematic cross-sectional view diagram, a semiconductor device in accordance with another embodiment of the present disclosure.

FIG. 13 illustrates, in a schematic cross-sectional view diagram, a semiconductor device 1B in accordance with another embodiment of the present disclosure.

With reference to FIG. 13, the semiconductor device 1B may have a structure similar to that illustrated in FIG. 12. The same or similar elements in FIG. 13 as in FIG. 12 have been marked with similar reference numbers and duplicative descriptions have been omitted.

With reference to FIG. 13, the insulating stack 200 may only include the bottom dielectric layer 201, the higher middle dielectric layer 205, and the top dielectric layer 207. The higher middle dielectric layer 205 may be disposed on the bottom dielectric layer 201. The conductive structure 300 may include the bottom portion 301, the higher middle portion 305, and the top portion 307. The higher middle portion 305 may be disposed on the bottom portion 301 and in the higher middle dielectric layer 205.

One aspect of the present disclosure provides a semiconductor device including a first insulating layer positioned on a substrate; a bottom contact positioned in the first insulating layer; a bottom dielectric layer, a lower middle dielectric layer, a higher middle dielectric layer, and a top dielectric layer sequentially stacked on the first insulating layer; and a conductive structure including a bottom portion positioned in the bottom dielectric layer and on the bottom contact, a lower middle portion positioned on the bottom portion and in the lower middle dielectric layer, a higher middle portion positioned on the lower middle portion and in the higher middle dielectric layer, and a top portion positioned on the higher middle portion and in the top dielectric layer. A carbon concentration of the lower middle dielectric layer is greater than a carbon concentration of the bottom dielectric layer.

Another aspect of the present disclosure provides a semiconductor device including a first insulating layer positioned on a substrate; a bottom contact positioned in the first insulating layer; a bottom dielectric layer, a higher middle dielectric layer, and a top dielectric layer sequentially stacked on the first insulating layer; and a conductive structure including a bottom portion positioned in the bottom dielectric layer and on the bottom contact, a higher middle portion positioned on the bottom portion and in the higher middle dielectric layer, and a top portion positioned on the higher middle portion and in the top dielectric layer. A carbon concentration of the higher middle dielectric layer is greater than a carbon concentration of the bottom dielectric layer.

Another aspect of the present disclosure provides a method for fabricating a semiconductor device including forming a first insulating layer on a substrate; forming a bottom contact in the first insulating layer; sequentially forming a bottom dielectric layer, a lower middle dielectric layer, a higher middle dielectric layer, and a top dielectric layer on the first insulating layer; performing an opening-etching process to form an opening along the top dielectric layer, the higher middle dielectric layer, the lower middle dielectric layer, and the bottom dielectric layer to expose the bottom contact; and forming a conductive structure in the opening. A carbon concentration of the lower middle dielectric layer is greater than a carbon concentration of the bottom dielectric layer.

Due to the design of the semiconductor device of the present disclosure, the critical dimensions can be controlled even using the same etching chemistry for different layers of the insulating stack 200 by employing different carbon concentrations for different layers of the insulating stack 200. As a result, the overlay of the conductive structure 300 to the bottom contact 105 may be improved. In addition, the parasitic capacitance originated from adjacent conductive structures 300 may be kept low due to the small critical dimension of the higher middle portion 305 of the conductive structure 300.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for fabricating a semiconductor device, comprising:
   forming a first insulating layer on a substrate;
   forming a bottom contact in the first insulating layer;
   sequentially forming a bottom dielectric layer, a lower middle dielectric layer, a higher middle dielectric layer, and a top dielectric layer on the first insulating layer;
   performing an opening-etching process to form an opening along the top dielectric layer, the higher middle dielectric layer, the lower middle dielectric layer, and the bottom dielectric layer to expose the bottom contact; and
   forming a conductive structure in the opening, wherein the conductive structure includes a bottom portion in the bottom dielectric layer, a lower middle portion in the lower middle dielectric layer and on the bottom portion, a higher middle portion in the higher middle dielectric layer and on the lower middle dielectric layer, and a top portion in the top dielectric layer and on the higher middle portion;
   wherein the bottom dielectric layer is disposed on the first insulating layer in which the bottom contact is deposited, and a carbon concentration of the bottom dielectric layer is smaller than a carbon concentration of the lower middle dielectric layer coupled with the first insulating,
   wherein a carbon concentration of the higher middle dielectric layer is less than the carbon concentration of the lower middle dielectric layer, and a carbon concentration of the top dielectric layer is greater than the carbon concentration of the higher middle dielectric layer.

2. The method of claim 1, wherein the carbon concentration of the higher middle dielectric layer is greater than the carbon concentration of the bottom dielectric layer.

3. The method of claim 2, wherein a minimum dimension of the lower middle portion is greater than a minimum dimension of the bottom portion.

4. The method of claim 2, wherein a minimum dimension of the higher middle portion is less than a minimum dimension of the lower middle portion.

5. The method of claim 2, wherein a dielectric constant of the bottom dielectric layer is greater than a dielectric constant of the higher middle dielectric layer, the dielectric constant of the higher middle dielectric layer is greater than a dielectric constant of the lower middle dielectric layer, and the dielectric constant of the lower middle dielectric layer and a dielectric constant of the top dielectric layer are substantially the same.

6. The method of claim 5, wherein the bottom dielectric layer comprises silicon oxide and silicon nitride.

7. The method of claim 5, where a thickness of the higher middle dielectric layer is greater than a thickness of the lower middle dielectric layer.

8. The method of claim 5, wherein the bottom portion comprises a tapered sidewall profile.

9. The method of claim 5, wherein the higher middle portion comprises a hyperbola-like sidewall profile.

10. A method for fabricating a semiconductor device, comprising:
    forming a first insulating layer on a substrate;
    forming a bottom contact in the first insulating layer;
    sequentially forming a bottom dielectric layer, a lower middle dielectric layer, a higher middle dielectric layer, and a top dielectric layer on the first insulating layer;
    performing an opening-etching process to form an opening along the top dielectric layer, the higher middle dielectric layer, the lower middle dielectric layer, and the bottom dielectric layer to expose the bottom contact; and
    forming a conductive structure in the opening, wherein the conductive structure includes a bottom portion in the bottom dielectric layer, a lower middle portion in the lower middle dielectric layer and on the bottom portion, a higher middle portion in the higher middle dielectric layer and on the lower middle dielectric layer, and a top portion in the top dielectric layer and on the higher middle portion;
    wherein the bottom dielectric layer is disposed on the first insulating layer in which the bottom contact is deposited, and a carbon concentration of the bottom dielectric layer is smaller than a carbon concentration of the higher middle dielectric layer coupled with the first insulating layer,
    wherein the carbon concentration of the higher middle dielectric layer is less than a carbon concentration of the top dielectric layer, and a minimum dimension of the higher middle portion is less than a minimum dimension of the top portion.

11. The method of claim 10, wherein the minimum dimension of the higher middle portion is less than a minimum dimension of the bottom portion.

12. The method of claim 10, wherein the minimum dimension of the higher middle portion and a minimum dimension of the bottom portion are substantially the same.

13. The method of claim 10, wherein a dielectric constant of the bottom dielectric layer is greater than a dielectric constant of the higher middle dielectric layer.

14. The method of claim 13, wherein the dielectric constant of the higher middle dielectric layer is greater than a dielectric constant of the top dielectric layer.

15. The method of claim 14, wherein the bottom dielectric layer comprises silicon oxide and silicon nitride.

16. The method of claim 10, wherein a thickness of the higher middle dielectric layer is greater than a thickness of the top dielectric layer.

17. The method of claim 10, wherein the bottom portion comprises a tapered sidewall profile.

18. The method of claim 10, wherein the higher middle portion comprises a hyperbola-like sidewall profile.

* * * * *